(12) United States Patent
Blatchford et al.

(10) Patent No.: US 10,103,171 B2
(45) Date of Patent: Oct. 16, 2018

(54) METAL ON ELONGATED CONTACTS

(71) Applicant: Texas Instruments Incorporated, Dallas, TX (US)

(72) Inventors: James Walter Blatchford, Richardson, TX (US); Scott William Jessen, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/066,297

(22) Filed: Mar. 10, 2016

(65) Prior Publication Data
US 2016/0190156 A1 Jun. 30, 2016

Related U.S. Application Data

(62) Division of application No. 14/572,905, filed on Dec. 17, 2014, now Pat. No. 9,312,170.

(60) Provisional application No. 61/916,865, filed on Dec. 17, 2013.

(51) Int. Cl.
| | |
|---|---|
| *H01L 23/52* | (2006.01) |
| *H01L 27/118* | (2006.01) |
| *H01L 21/768* | (2006.01) |
| *H01L 27/092* | (2006.01) |
| *H01L 21/28* | (2006.01) |
| *H01L 21/283* | (2006.01) |
| *H01L 23/485* | (2006.01) |
| *H01L 21/8238* | (2006.01) |
| *H01L 21/311* | (2006.01) |

(52) U.S. Cl.
CPC ...... *H01L 27/11807* (2013.01); *H01L 21/283* (2013.01); *H01L 21/28008* (2013.01); *H01L 21/31144* (2013.01); *H01L 21/76802* (2013.01); *H01L 21/76816* (2013.01); *H01L 21/76843* (2013.01); *H01L 21/76895* (2013.01); *H01L 21/823871* (2013.01); *H01L 23/485* (2013.01); *H01L 27/092* (2013.01); *H01L 2027/11866* (2013.01); *H01L 2924/0002* (2013.01)

(58) Field of Classification Search
CPC ..... H01L 23/52; H01L 23/522; H01L 23/528; H01L 23/538; H01L 23/5386
See application file for complete search history.

(56) References Cited

U.S. PATENT DOCUMENTS

| | | | |
|---|---|---|---|
| 7,037,774 B1 | 5/2006 | Syau | |
| 2004/0018725 A1* | 1/2004 | Cho | G11C 11/412 |
| | | | 438/672 |
| 2007/0117372 A1 | 5/2007 | Hsu et al. | |

(Continued)

*Primary Examiner* — Jae Lee
(74) *Attorney, Agent, or Firm* — Jacqueline J. Garner; Charles A. Brill; Frank D. Cimino

(57) ABSTRACT

An integrated circuit containing elongated contacts, including elongated contacts which connect to at least three active areas and/or MOS gates, and including elongated contacts which connect to exactly two active areas and/or MOS gates and directly connect to a first level interconnect. A process of forming an integrated circuit containing elongated contacts, including elongated contacts which connect to at least three active areas and/or MOS gates, using exactly two contact photolithographic exposure operations, and including elongated contacts which connect to exactly two active areas and/or MOS gates and directly connect to a first level interconnect.

11 Claims, 19 Drawing Sheets

(56) References Cited

U.S. PATENT DOCUMENTS

2014/0273347 A1\* 9/2014 Tseng ................ H01L 21/76895
 438/107

\* cited by examiner

METAL ON ELONGATED CONTACTS

CROSS-REFERENCE TO RELATED APPLICATIONS

This application is a divisional of U.S. nonprovisional patent application Ser. No. 14/572,905, filed Dec. 17, 2014 which claims the benefit of U.S. provisional application 61/916,865, filed Dec. 17, 2013, the contents of both of which are herein incorporated by reference in its entirety.

The following co-pending patent application is related and hereby incorporated by reference: U.S. patent application Ser. No. 14/572,891.

FIELD OF THE INVENTION

This invention relates to the field of integrated circuits. More particularly, this invention relates to contacts and interconnects in integrated circuits.

BACKGROUND OF THE INVENTION

Contacts and first level interconnects in integrated circuits may be formed by photolithographically defining areas to be etched. For example, contacts may be formed by exposing contact areas in a contact photosensitive layer, followed by developing the contact photosensitive layer to form a contact etch mask, and subsequently etching a dielectric layer to form contact holes and filling the contact holes with contact metal. Similarly, metal first level interconnects may be formed above the contacts by exposing interconnect areas in an interconnect photosensitive layer, followed by developing the first level interconnect photosensitive layer to form an interconnect etch mask. It may be desirable to use photolithographic equipment to expose the contact photosensitive layer and the interconnect photosensitive layer which has a spatial resolution limit which is larger than the separation between some contacts and/or some first level interconnects, for example in instances wherein photolithographic equipment with a smaller spatial resolution limit is more expensive.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by exposing a contact etch pattern in exactly two exposure operations, so as to form contacts which include elongated contacts, that is, contacts which connect to more than one active area or MOS transistor gate, which are not in memory cells. Metal first level interconnects are formed immediately above the contacts. Elongated contacts which connect to exactly two active areas and/or MOS gates also directly connect to first level interconnects.

DETAILED DESCRIPTION OF EXAMPLE EMBODIMENTS

Figure 1A:
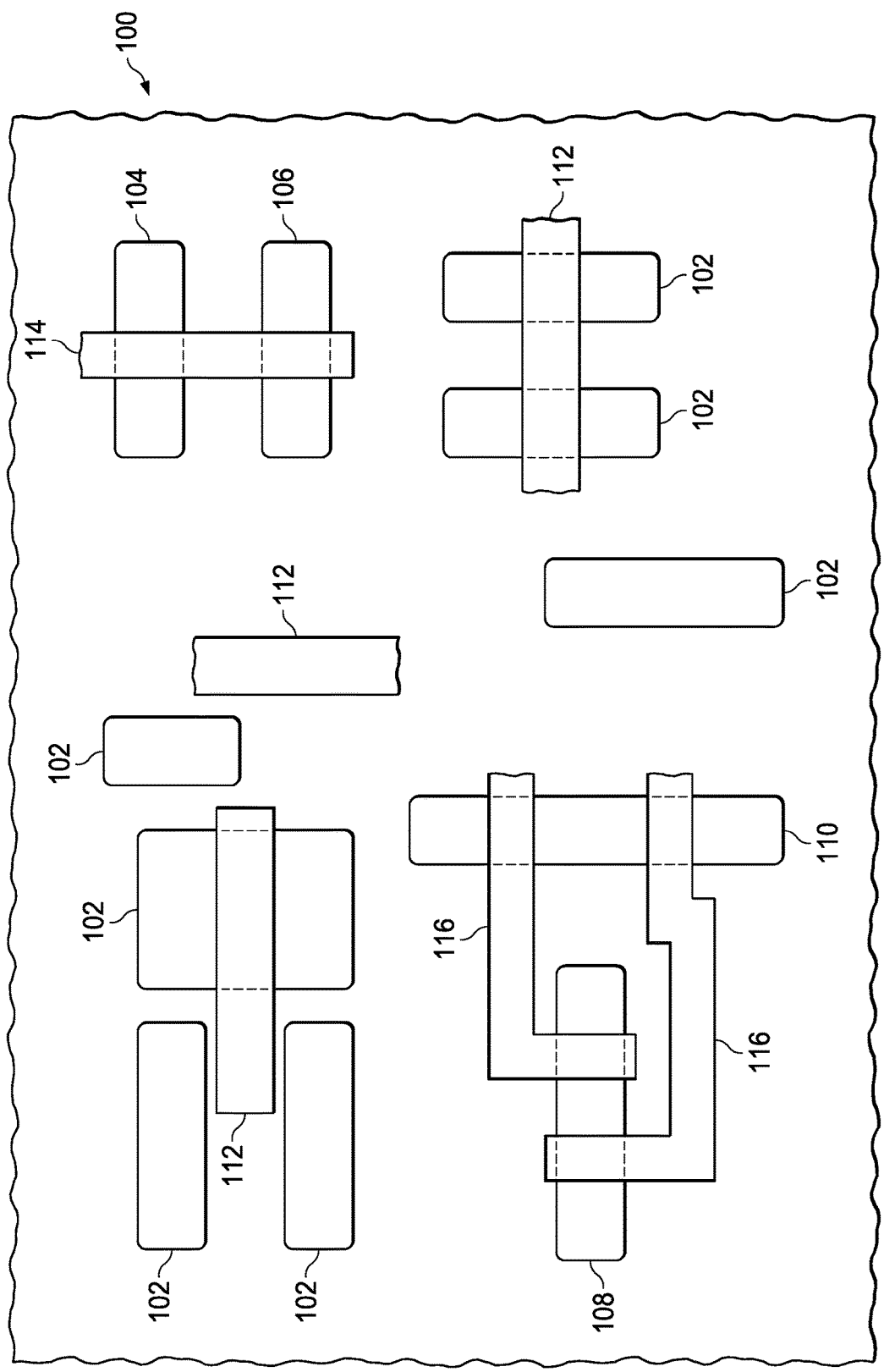
FIG. 1A through FIG. 1G are top views of an integrated circuit formed according to an example, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "contacts" is understood to refer to metal elements which connect to active areas and/or metal oxide semiconductor (MOS) transistor gates, hereafter referred to as MOS gates, in an integrated circuit. Active areas and/or MOS gates may include a layer of metal silicide, such that the contacts touch the metal silicide layer. MOS gates include contiguous gate material over field oxide.

An integrated circuit may be formed by performing exactly two cycles of exposing and developing contact subpatterns. Etch operations follow each contact subpattern develop step, and the first contact subpattern is removed prior to forming the second contact subpattern. An optional contact etch hard mask layer may be used in the fabrication sequence. The contacts include elongated contacts, which are contacts which connect to more than one active area or MOS gate in the integrated circuit, which are not in memory cells. Damascene first level interconnects immediately above the contacts may be formed by forming an intra metal dielectric (IMD) layer above the contacts, and performing exactly two cycles of exposing and developing interconnect subpatterns. Etch operations follow each interconnect subpattern develop step, and the first interconnect subpattern is removed prior to forming the second interconnect subpattern. An optional interconnect etch hard mask layer may be used in the fabrication sequence. Interconnect trenches are etched in the IMD layer through the interconnect trench hard mask layer. The interconnect trenches are filled with interconnect material such as a liner metal and copper fill metal. Elongated contacts which connect to exactly two active area and/or MOS gates also directly connect to first level interconnect elements.

FIG. 1A through FIG. 1G are top views of an integrated circuit formed according to an example, depicted in successive stages of fabrication. Referring to FIG. 1A, the integrated circuit 100 includes active areas 102 which are not part of memory cells, an inverter p-type active area 104 and an inverter n-type active area 106 which are part of a complementary metal oxide semiconductor (CMOS) inverter, and possibly a dual input logic gate p-type active area 108 and a dual input logic gate n-type active area 110 which are part of a CMOS dual input logic gate. The integrated circuit 100 also includes MOS gates 112 which are not part of memory cells, an inverter MOS gate 114 which is part of the CMOS inverter crossing the inverter p-type active area 104 and the inverter n-type active area 106, and, if the CMOS dual input logic gate is present, two dual input logic gate MOS gates 116 crossing the dual input logic gate p-type active area 108 and the dual input logic gate n-type active area 110. A PMD layer, not shown, is formed over an existing top layer of the integrated circuit 100, covering the active areas 102, 104, 108, and 110, and the MOS gates 112, 114 and 116. A contact hard mask layer, not shown, may be formed over the PMD layer. The contact hard mask layer may include one or more sublayers of materials resistant to etchants of the PMD main layer, such as silicon nitride, silicon carbide, aluminum oxide, and amorphous carbon under silicon oxy-nitride.

A positive acting first contact photosensitive layer, not shown, is formed over the PMD layer. A positive acting photosensitive layer changes chemical form in regions exposed by light of a particular wavelength band, for example a band around 193 nanometers, so that exposed areas are removed during a subsequent develop operation. Unexposed areas of the positive acting photosensitive layer remain after the develop operation is completed. The first contact photosensitive layer may include positive photoresist, one or more optional anti-reflection layers such as a bottom anti-reflection coating (BARC) and one or more optional layers to improve the lithography process, such as a layer to reduce friction between the first contact photosensitive layer and an immersion fluid used in photolithography equipment to expose the first contact photosensitive layer.

Figure 1B:
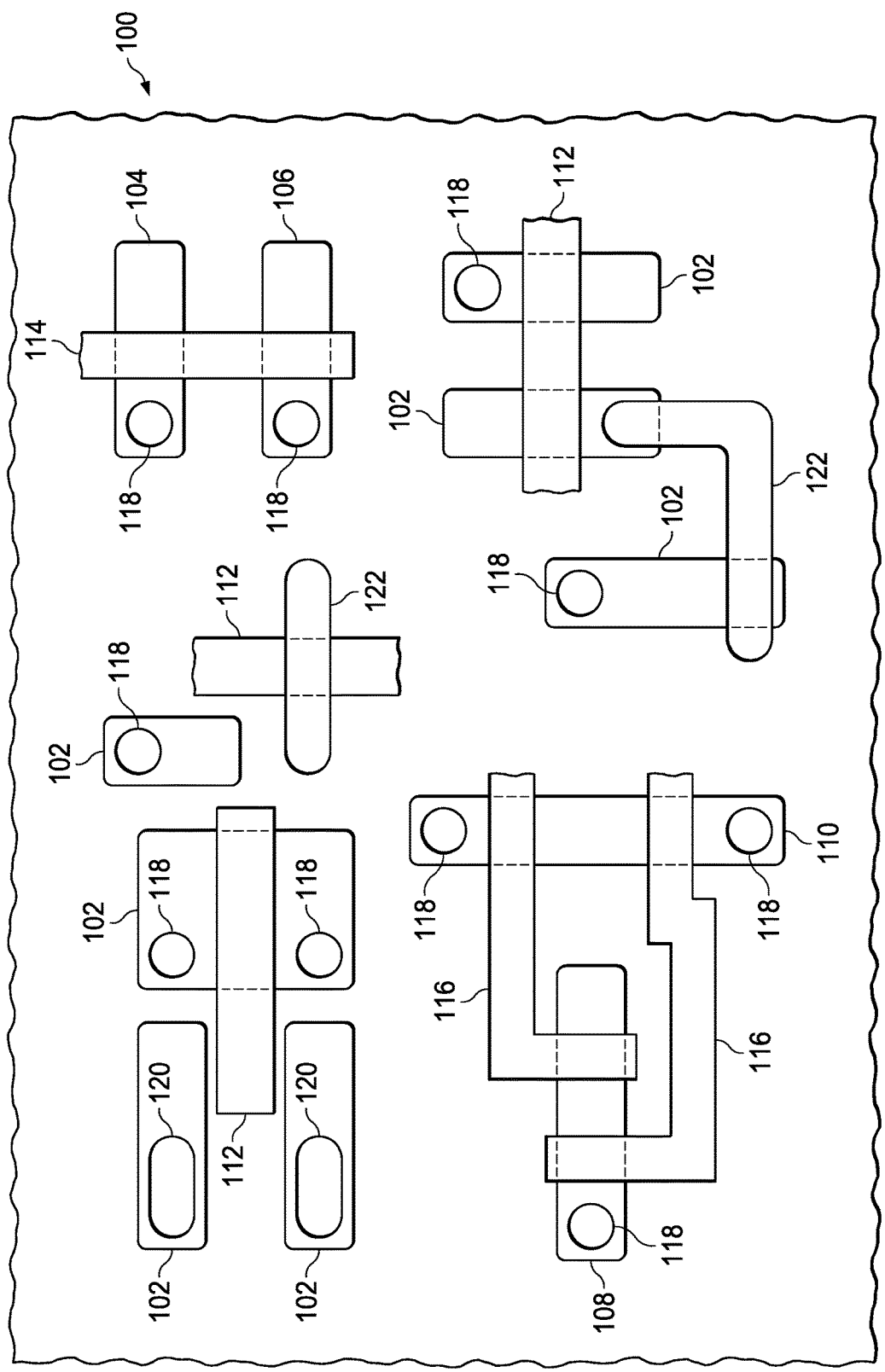

A first contact subpattern exposure operation and a subsequent develop operation are performed on the integrated circuit 100 which forms a first plurality of contact patterned regions, in the first contact photosensitive layer. The first plurality of contact patterned regions is formed using a single exposure step. The first plurality of contact patterned regions includes single node contact patterns which define areas for single node contacts which directly connect to exactly one active area or MOS gate. Referring to FIG. 1B, some instances of the single node contact patterns may be compact single node contact patterns 118 which have length:width ratios between 0.8 and 1.0. Length:width ratios refer to lateral dimensions of the contact patterns and contacts. Some instances of the single node contact patterns may be elongated single node contact patterns 120 which have length:width ratios above 2. The first plurality of contact patterned regions also includes elongated contact patterns 122 which define areas for elongated contacts which directly connect to more than one active area and/or MOS gate. Some instances of elongated contact patterns 122 may be linear. Some instances of elongated contact patterns 122 may be nonlinear, such as the L-shaped elongated contact pattern depicted in FIG. 1B.

Figure 1C:
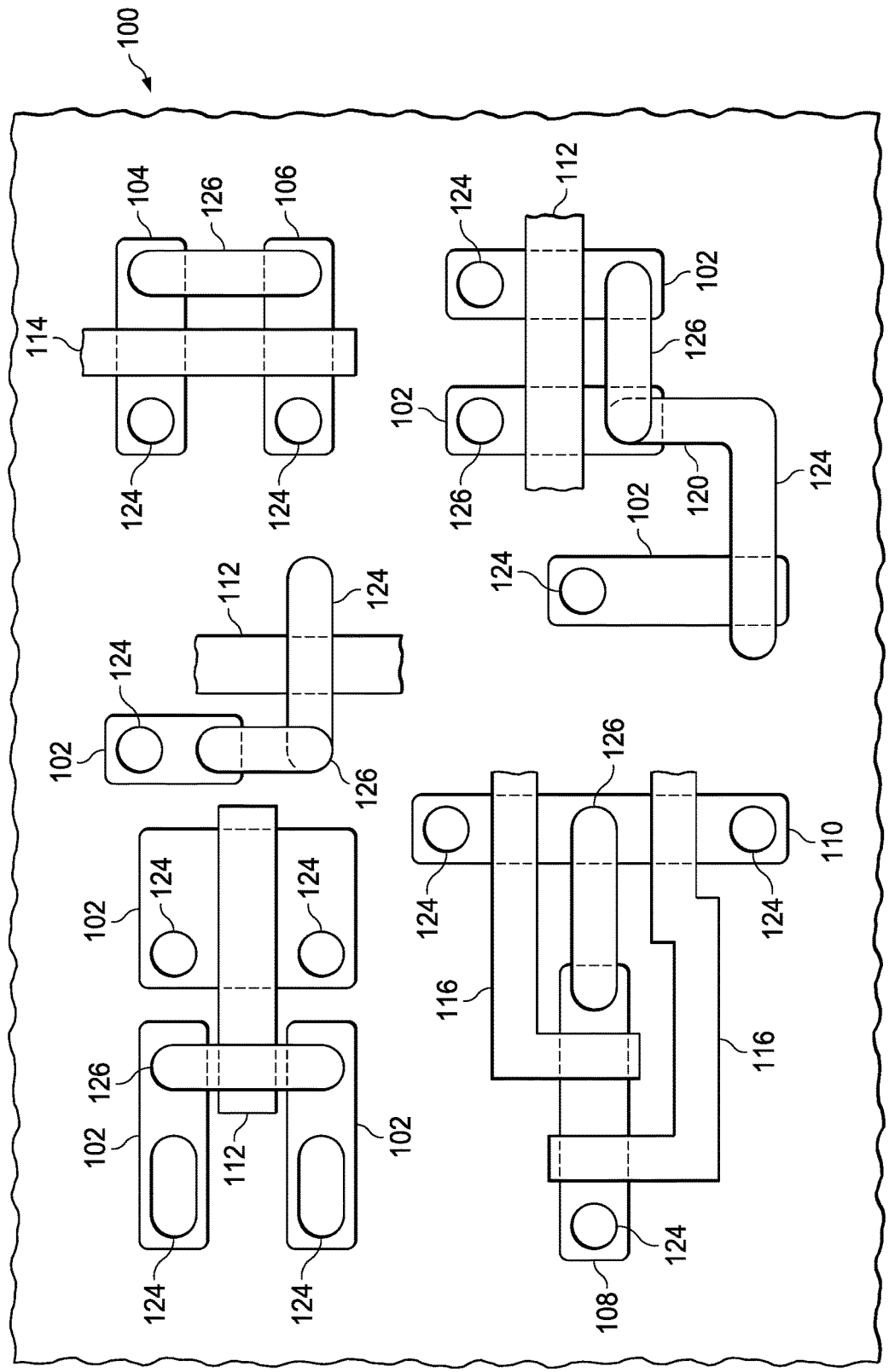

FIG. 1C depicts a subsequent stage of fabrication of the integrated circuit 100 in which openings 124 are formed. In a version of the example using the contact hard mask layer, a first contact hard mask etch process is performed on the integrated circuit 100 which removes material from the contact hard mask layer under the first plurality of contact patterned regions to form openings 124 in the contact hard mask layer. The first contact photosensitive layer is removed after the first contact hard mask etch process is performed.

In a version of the example which do not include a contact hard mask layer, a first contact etch process is performed on the integrated circuit 100 which removes material from the PMD layer under the first plurality of contact patterned regions to form openings 124 in the PMD layer. The first contact photosensitive layer is removed after the first contact etch process is performed.

A second contact photosensitive layer, not shown, is formed above an existing top surface of the integrated circuit 100, with materials and properties similar to the first contact photosensitive layer. A second contact subpattern exposure operation and subsequent develop operation is performed on the integrated circuit 100 which forms a second plurality of contact exposed regions 126 in the second contact photosensitive layer. The second plurality of contact exposed regions 126 is formed using a single exposure step. Some members of the second plurality of contact exposed regions 126 may overlap or abut members of the openings 124. In one version of the instant example, some members of the second plurality of contact exposed regions 126 may be located proximate to some members of the openings 124 by less than a spatial resolution limit of the photolithography equipment used to perform the first contact subpattern exposure operation and/or the second contact subpattern exposure operation. No other contact subpattern exposure operations are performed.

Figure 1D:
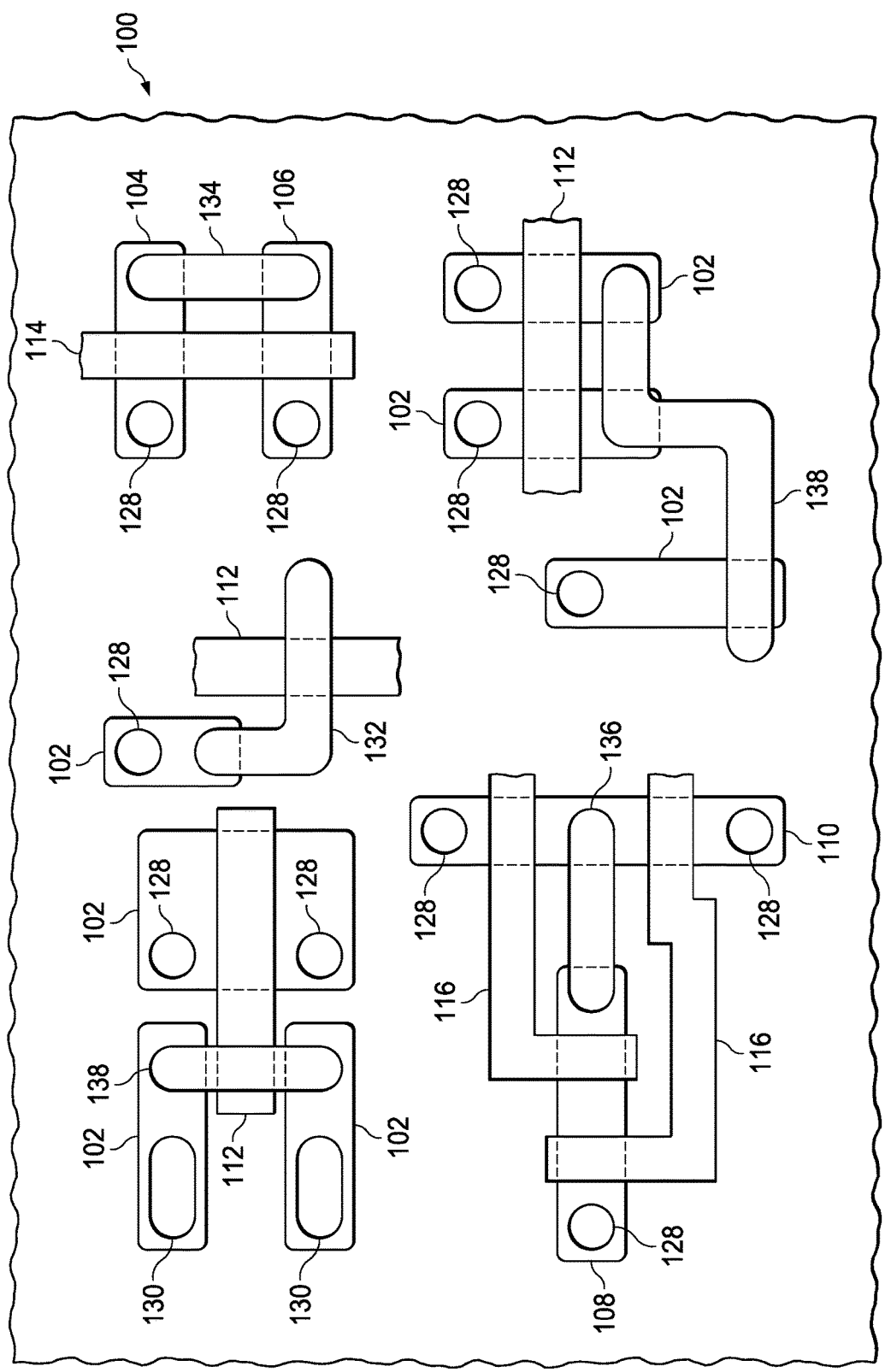

FIG. 1D depicts a subsequent stage of fabrication of the integrated circuit 100. In a version of the example using the contact hard mask layer, a second contact hard mask etch process is performed on the integrated circuit 100 which removes material from the contact hard mask layer under the second plurality of contact patterned regions to form, with the first plurality of contact hard mask openings, a plurality of contact hard mask openings in the contact hard mask layer. Contact holes are subsequently etched in the PMD layer under the first plurality of contact hard mask openings and the second plurality of contact hard mask openings.

In a version of the example which does not include a contact hard mask layer, a second contact etch process is performed on the integrated circuit 100 which removes material from the PMD layer under the second plurality of contact patterned regions 126 of FIG. 1C to form a second plurality of contact holes in the PMD layer. The second contact photosensitive layer is removed after the second contact etch process is performed.

A plurality of contacts are formed in the contact holes in the PMD layer, for example by filling the contact holes with contact metal, such as a liner metal and tungsten contact fill metal. Bottom surfaces of at least a portion of the contacts connect with a portion of or all of the active areas 102, 104, 108, and 110, and the MOS gates 112, 114 and 116. The plurality of contacts includes single node contacts which connect to a single active area 102 or a single MOS gate 112. Some instances of the single node contacts may be compact single node contacts 128 which have length:width ratios between 0.8 and 1.0. Some instances of the single node contacts may be elongated single node contacts 130 which have length:width ratios above 2. The plurality of contacts also includes elongated contacts which connect to two or more active areas 102 and/or MOS gates 112 which are not in memory cells. Included in the plurality of elongated contacts are dual node elongated contacts 132 which connect to exactly two active areas 102 and/or MOS gates 112, and which are subsequently directly connected to a first level interconnect. Some of the dual node elongated contacts are inverter output node elongated contacts 134 in CMOS inverters which connect an output node of the inverter p-type active area 104 with an output node of the inverter n-type active area 106. If the CMOS dual input logic gate is formed, one of the dual node elongated contacts is a CMOS dual input logic gate contact 136 which connects an output node of the CMOS dual input logic gate p-type active area 108 with an output node of the CMOS dual input logic gate n-type active area 110. Also included in the plurality of elongated contacts are multiple node elongated contacts 138 which connect to three or more active areas 102 and/or MOS gates 112. Some of the elongated contacts may be formed by one or more members of the first plurality of contact exposed region and one or more members of the second plurality of contact exposed region.

Figure 1E:
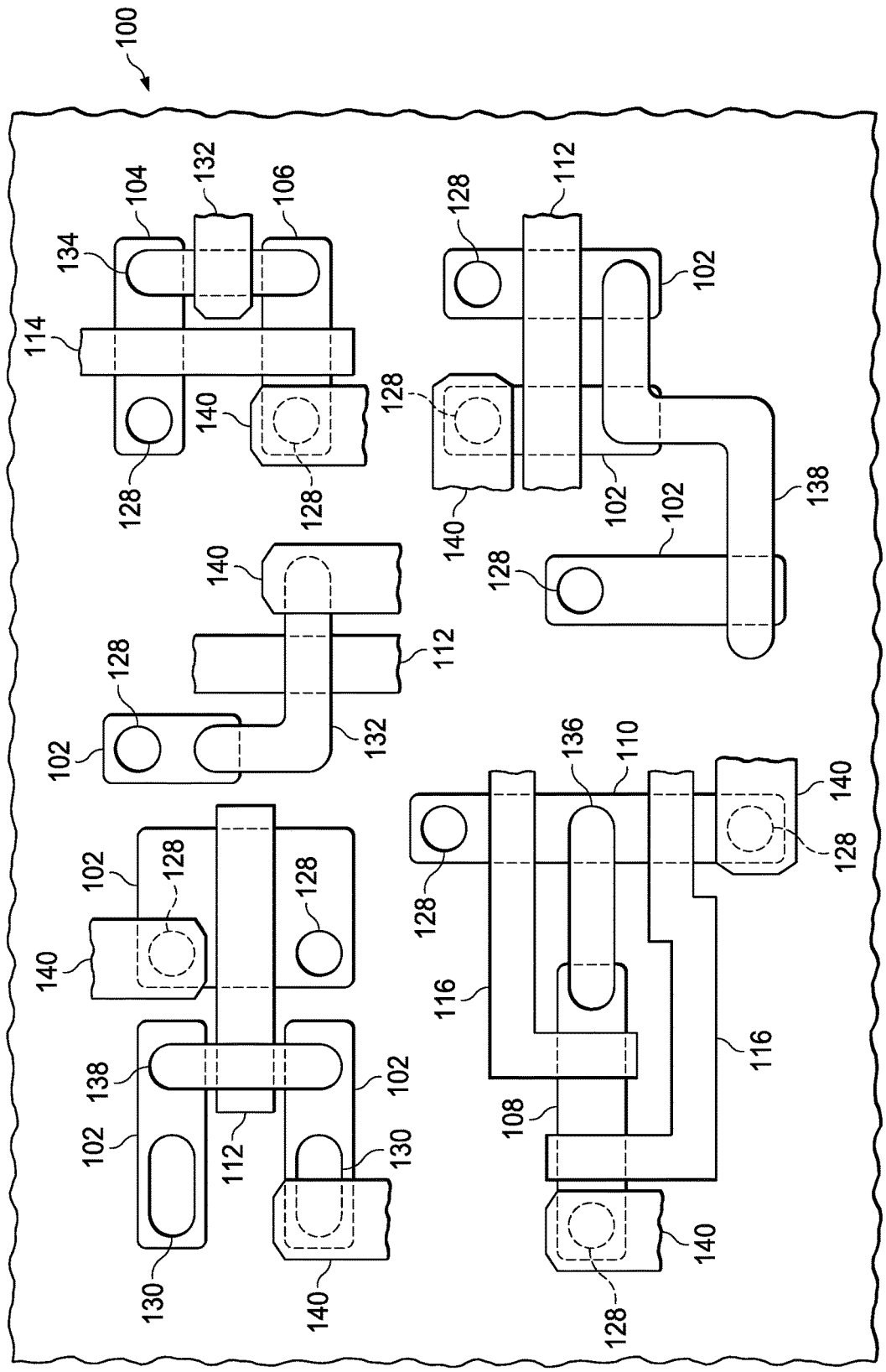

An IMD layer, not shown, is formed on the contacts and the PMD layer. First level interconnects are formed in the IMD layer by a damascene process above the plurality of contacts so as to directly connect to some, or possibly all, of the contacts. Referring to FIG. 1E, an optional interconnect hard mask layer, not shown, may be formed above the IMD layer. The interconnect hard mask layer if formed may include one or more sublayers of materials resistant to etchants of the IMD layer, such as silicon nitride, silicon carbide, aluminum oxide, and titanium nitride. A positive acting first interconnect photosensitive layer, not shown, is formed on an existing top surface of the integrated circuit 100. The first interconnect photosensitive layer may include photoresist, one or more optional anti-reflection layers and one or more optional layers to improve the lithography process. A first interconnect subpattern exposure operation and develop operation are performed on the integrated circuit 100 which forms a first plurality of interconnect patterned regions in the interconnect photosensitive layer. The first plurality of interconnect patterned regions is formed using a single exposure step.

In a version of the example using the interconnect hard mask layer, a first interconnect hard mask etch process is performed on the integrated circuit 100 which removes material from the interconnect hard mask layer under the first plurality of interconnect patterned regions to form first openings 140 in the interconnect hard mask layer. The first interconnect photosensitive layer is removed after the first interconnect hard mask etch process is performed.

In a version of the example which do not include an interconnect hard mask layer, a first interconnect etch process is performed on the integrated circuit 100 which removes material from the ILD layer under the first plurality of interconnect patterned regions to form first openings 140 in the ILD layer. The first interconnect photosensitive layer is removed after the first contact etch process is performed.

Figure 1F:
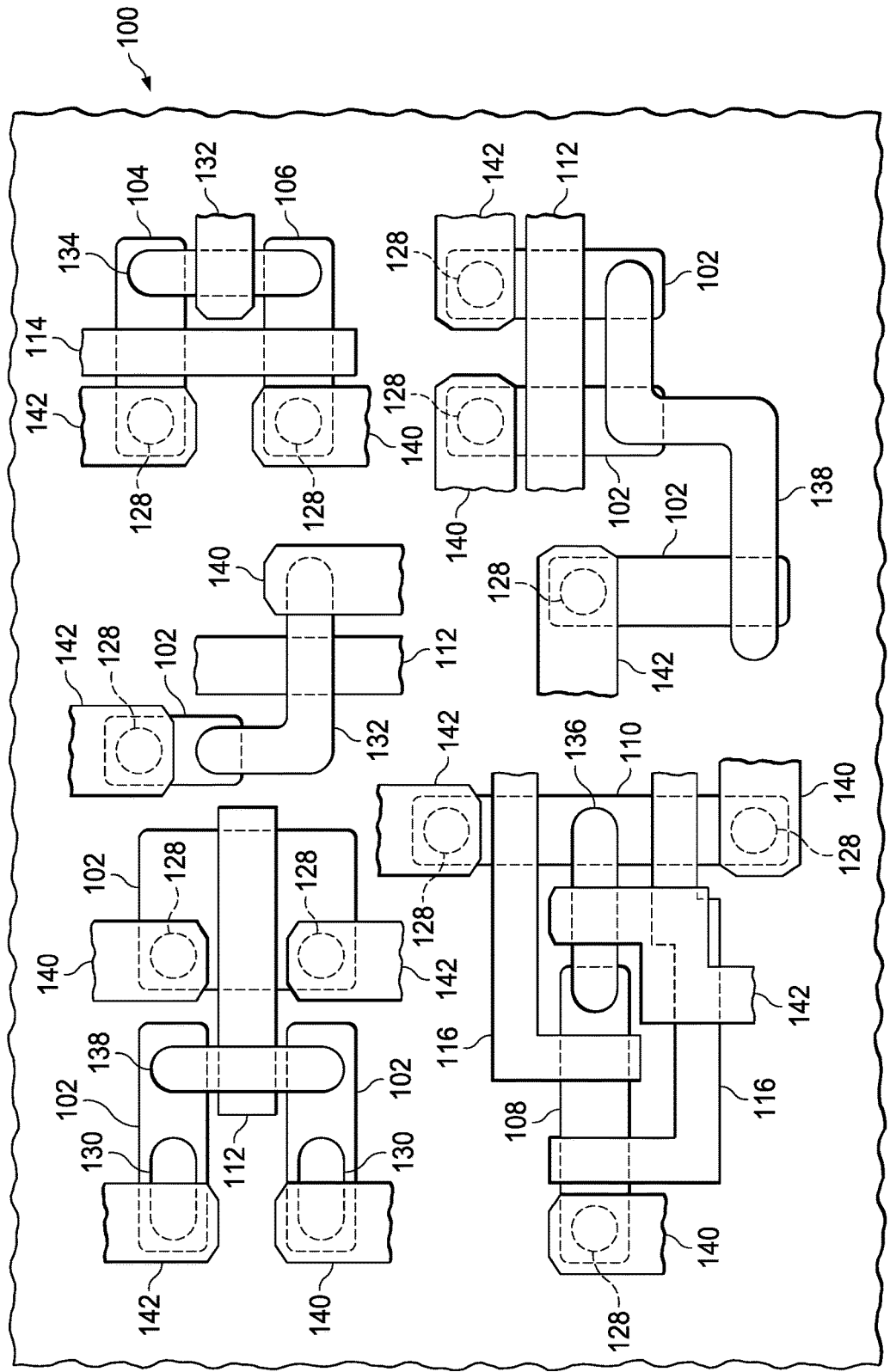

Referring to FIG. 1F, a positive acting second interconnect photosensitive layer, not shown, is formed on an existing top surface of the integrated circuit 100, with materials and properties similar to the first interconnect photosensitive layer. A second interconnect subpattern exposure operation and develop operation are performed on the integrated circuit 100 which forms a second plurality of interconnect patterned regions in the second interconnect photosensitive layer. The second plurality of interconnect patterned regions is formed using a single exposure step.

In a version of the example using the contact hard mask layer, a second interconnect hard mask etch process is performed on the integrated circuit 100 which removes material from the interconnect hard mask layer under the second plurality of interconnect patterned regions to form second openings 142 in the interconnect hard mask layer. The second interconnect photosensitive layer is removed after the second interconnect hard mask etch process is performed. No other interconnect subpattern exposure operations are performed. An interconnect trench etch process is subsequently performed on the integrated circuit 100 which removes material from the ILD layer under the first openings 140 and the second openings 142 to extend openings 140 and 142 to form interconnect trenches in the ILD layer.

In a version of the example which does not include an interconnect hard mask layer, a second interconnect etch process is performed on the integrated circuit 100 which removes material from the ILD layer under the second plurality of interconnect patterned regions form second openings 142 in the ILD layer. The second contact photosensitive layer is removed after the second interconnect etch process is performed.

Some members of the second openings 142 may be contiguous with members of the first openings 140. In one version of the instant example, some members of the second openings 142 may be located proximate to some members of the first openings 140 by less than a spatial resolution limit of the photolithography equipment used to perform the first interconnect subpattern exposure operation and/or the second interconnect subpattern exposure operation.

Figure 1G:
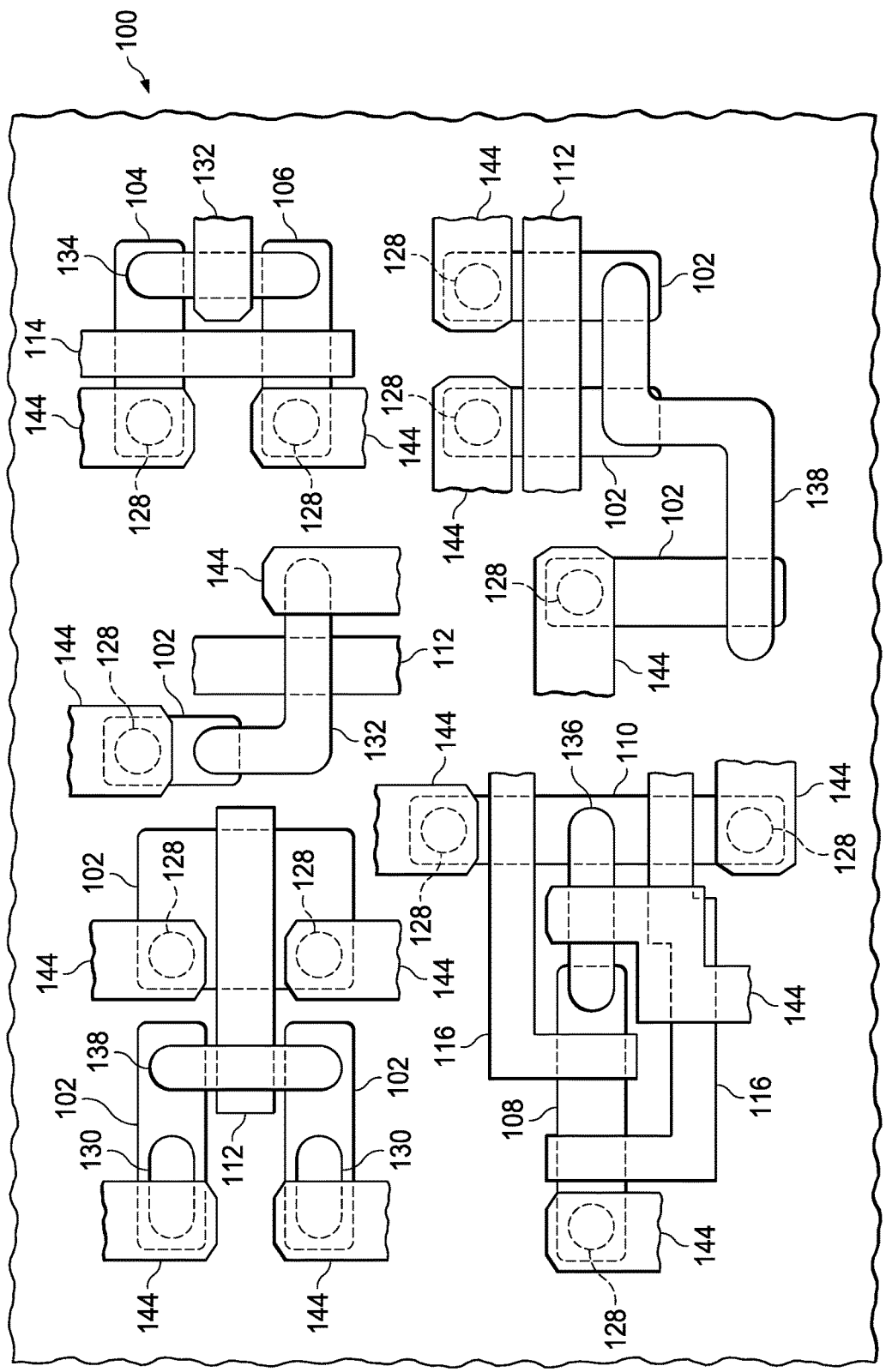

Referring to FIG. 1G, a plurality of first level interconnects 144 are formed in the openings 140 and 142, for example by filling the openings 140 and 142 with an interconnect metal, such as a liner metal including tantalum nitride and a fill metal including at least 90 percent copper, and removing unwanted liner metal and fill metal using a CMP operation. Bottom surfaces of at least a portion of the first level interconnects 144 directly connect to a portion of or possibly all of the contacts.

Dual node elongated contacts 132 are directly connected to first level interconnects 144. Additional levels of dielectric layers and interconnects, not shown, for example vertical interconnects, also known as vias, are formed above the first level interconnects 144. A plurality of interconnects in the additional levels directly connects to some or all members of the plurality of first level interconnects 144.

Figure 2A:
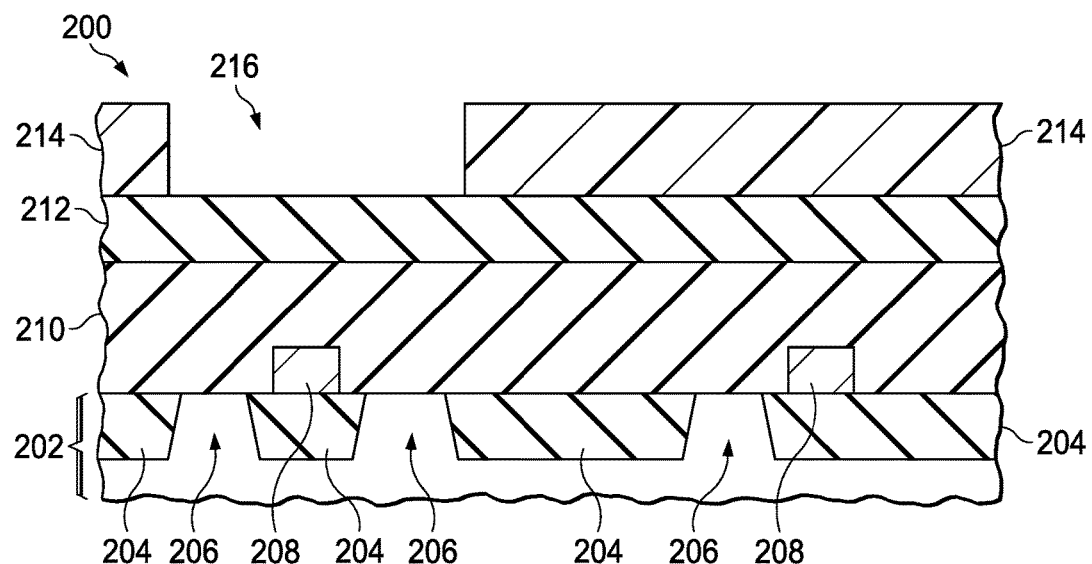
FIG. 2A through FIG. 2M are cross-sections of an integrated circuit formed according to an example, depicted in successive stages of fabrication.

FIG. 2A through FIG. 2M are cross-sections of an integrated circuit formed according to the example of FIG. 1A-1G including the optional hardmask layers, depicted in successive stages of fabrication. Referring to FIG. 2A, the integrated circuit 200 is formed in and on a substrate 202 which may be a single crystal silicon wafer, a silicon-on-insulator (SOI) wafer, a hybrid orientation technology (HOT) wafer with regions of different crystal orientations, or other material appropriate for fabrication of the integrated circuit 200. Elements of field oxide 204 are formed at a top surface of the substrate 202 typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). Regions at the top surface of the substrate 202 between the field oxide 204 are active areas 206 of the integrated circuit 200. The active areas 206 may include a layer of metal silicide at a top surface of the substrate 202. MOS gates 208 are formed over the substrate 202. A PMD layer 210 is formed over the active areas 206 and the MOS gates 208. The PMD layer 210 may be a dielectric layer stack including a PMD liner, a PMD main layer, and an optional PMD cap layer. The PMD liner is commonly silicon nitride or silicon dioxide, 10 to 100 nanometers thick, deposited by plasma enhanced chemical vapor deposition (PECVD) over the active areas 206, the MOS gates 208 and the field oxide 204. The PMD main layer is commonly a layer of silicon dioxide, phosphorus silicate glass (PSG) or boron phosphorus silicate glass (BPSG), commonly 100 to 100 nanometers thick, deposited by PECVD on a top surface of the PMD liner, and sometimes leveled by a chemical mechanical polish (CMP) process. The optional PMD cap layer is commonly 10 to 100 nanometers of a hard material such as silicon nitride, silicon carbide nitride or silicon carbide, formed on a top surface of the PMD main layer. A contact hard mask layer 212 is formed over the PMD layer. The contact hard mask layer 212 may include one or more sublayers of materials resistant to etchants of the PMD main layer, such as silicon nitride, silicon carbide, aluminum oxide, and amorphous carbon under silicon oxy nitride.

A positive acting first contact photosensitive layer 214 is formed over the contact hard mask layer 212. The first contact photosensitive layer 214 may include positive acting photoresist, one or more optional anti-reflection layers and one or more optional layers to improve the lithography process. A first contact subpattern exposure operation using photolithographic equipment such as an immersion wafer scanner and a first contact subpattern develop operation are performed on the integrated circuit 200, which forms a first contact patterned region 216 in the first contact photosensitive layer 214. Other contact exposed regions, such as those shown in FIG. 1B (118, 120, 122), are formed in the first contact photosensitive layer 214 by the first contact subpattern exposure operation and first contact subpattern develop operation.

Figure 2B:
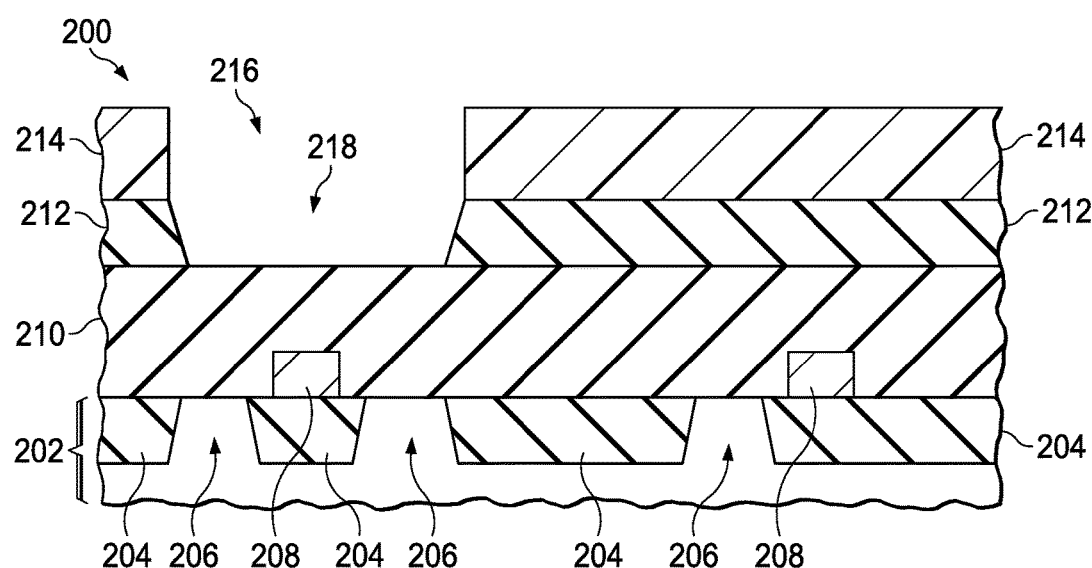

Referring to FIG. 2B, a first contact hard mask etch process is performed on the integrated circuit 200 which removes material from the contact hard mask layer 212 under the first contact patterned region 216 to form a first contact hard mask opening 218 in the contact hard mask layer 212. The first contact photosensitive layer 214 is removed after the first contact hard mask etch process is performed.

Figure 2C:
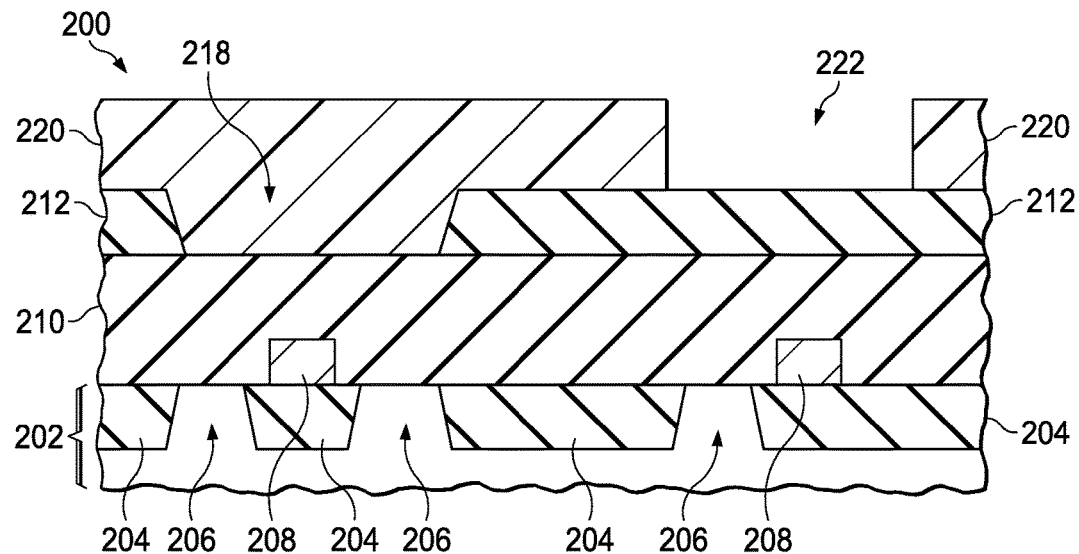

Referring to FIG. 2C, a positive acting second contact photosensitive layer 220 is formed over the contact hard mask layer 212. The second contact photosensitive layer 220 has similar components and properties as the first contact photosensitive layer 214 of FIG. 2A. A second contact subpattern exposure operation and a second contact subpattern develop operation are performed on the integrated circuit 200 which forms a second contact patterned region 222 in the second contact photosensitive layer 220. Other contact exposed regions, such as those shown in FIG. 1C (126), are formed in the second contact photosensitive layer 220 by the second contact subpattern exposure operation and the second contact subpattern develop operation.

Figure 2D:
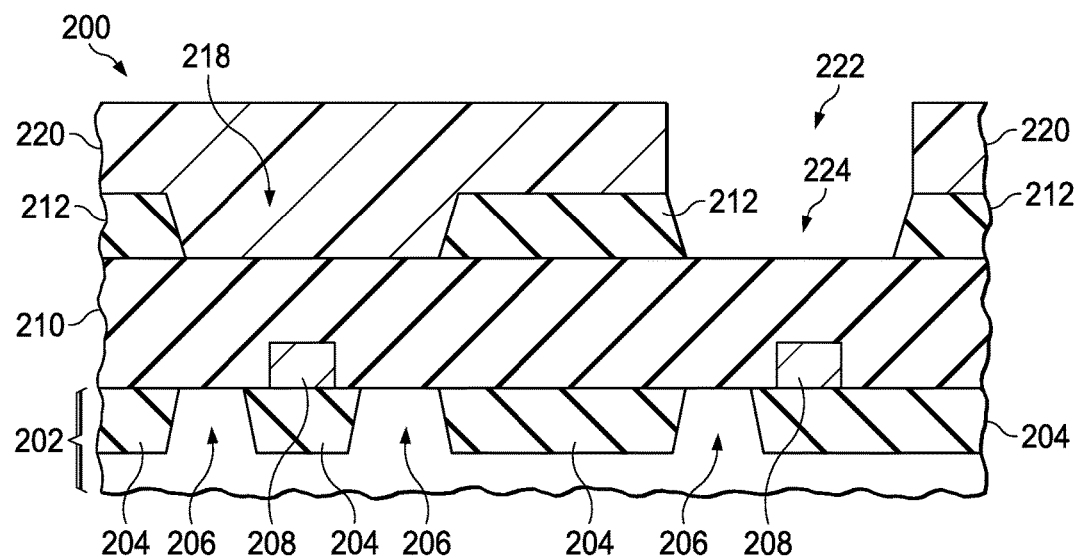

Referring to FIG. 2D, a second contact hard mask etch process is performed on the integrated circuit 200 which removes material from the contact hard mask layer 212 under the second contact patterned region 222 to form a second contact hard mask opening 224 in the contact hard mask layer 212. The second contact photosensitive layer 220 is removed after the second contact hard mask etch process is performed. In one version of the instant example, the second contact hard mask opening 224 may be located proximate to the first contact hard mask opening 218 by less than a spatial resolution limit of the photolithography equipment used to perform the first contact subpattern exposure operation and/or the second contact subpattern exposure operation. No other contact subpattern exposure operations are performed. In one version of the instant example, contact hard mask openings formed by the second contact subpattern exposure operation may abut contact hard mask openings formed by the first contact subpattern exposure operation, not shown in FIG. 2D.

Figure 2E:
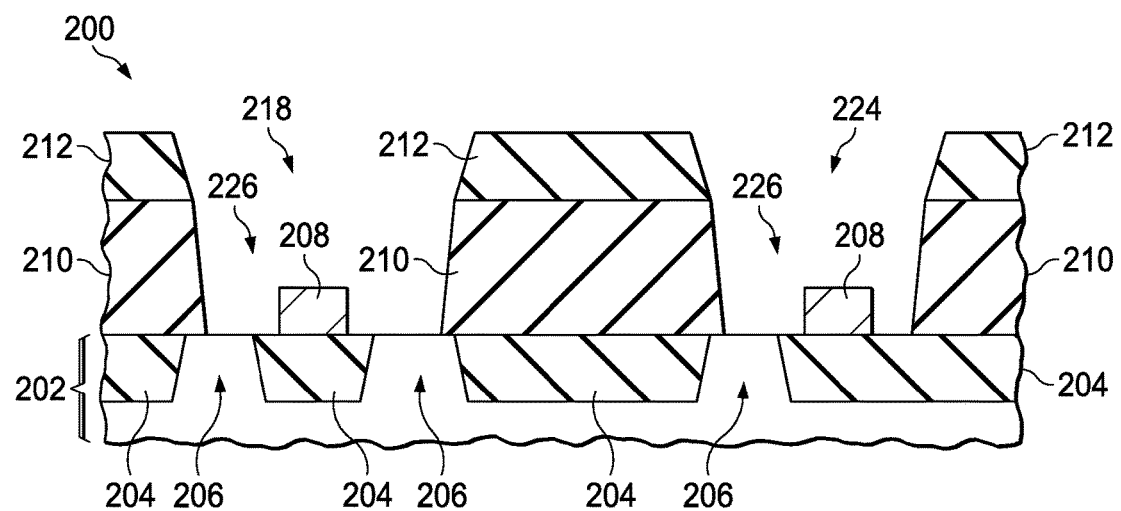

Referring to FIG. 2E, a contact etch process such as a reactive ion etch (ME) process is performed on the integrated circuit 200 which removes material from the PMD layer 210 below the first contact hard mask opening 218 and the second contact hard mask opening 224 to form contact holes 226 in the PMD layer 210.

Figure 2F:
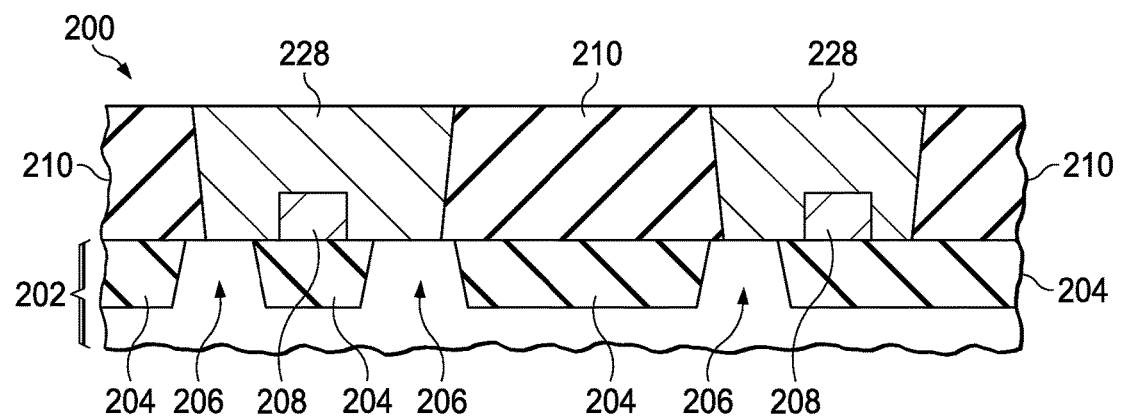

Referring to FIG. 2F, contacts 228 are formed in the contact holes 226 of FIG. 2D, for example by forming a contact metal liner such as a titanium liner in the contact holes 226, forming a layer of contact fill metal such as tungsten in the contact holes on the contact metal liner, and removing unwanted metal from a top surface of the PMD layer 210 using a CMP process and/or an etchback process. Bottom surfaces of a portion of or all of the contacts 228 formed in the integrated circuit 200 connect to a portion of or all of the active areas 206 and the MOS gates 208. The contacts 228 may in some instances extend past edges of the active areas 206 and/or the MOS gates 208 or may in other instances not extend past edges of the active areas 206 and/or the MOS gates 208.

Figure 2G:
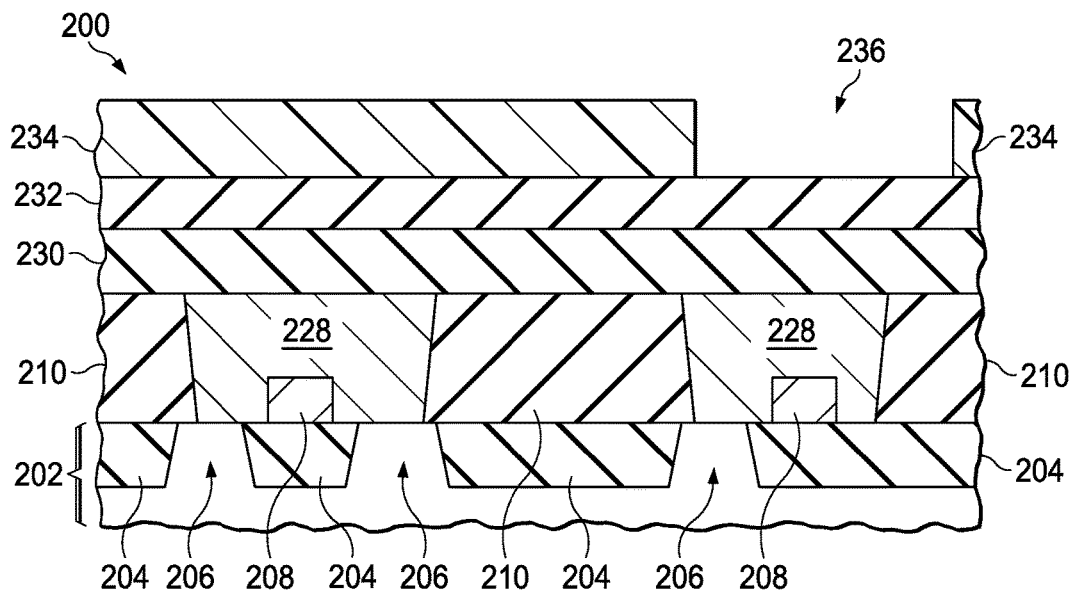

Referring to FIG. 2G, an IMD layer 230 is formed over the contacts 228 and the PMD layer 210. The IMD layer 230 may include a low-k dielectric material such as organosilicate glass (OSG), carbon-doped silicon oxides (SiCO or CDO) or methylsilsesquioxane (MSQ). The IMD layer 230 may also include an etch stop sublayer, not shown, adjacent to the contacts 228. The IMD layer 230 may further include a cap sublayer, not shown, at a top surface of the IMD layer 230. An interconnect hard mask layer 232 is formed above the IMD layer 230. The interconnect hard mask layer 232 may have the components and properties described in reference to FIG. 1F. A positive acting first interconnect photosensitive layer 234 is formed over the interconnect hard mask layer 232. The first interconnect photosensitive layer may include positive photoresist, one or more optional anti-reflection layers and one or more optional layers to improve the lithography process. A first interconnect subpattern exposure operation and a first interconnect subpattern develop operation are performed on the integrated circuit 200 which form a first interconnect patterned region 236 in the first interconnect photosensitive layer 234. Other interconnect patterned regions, not shown, are formed in the first interconnect photosensitive layer 234 by the first interconnect subpattern exposure operation.

Figure 2H:
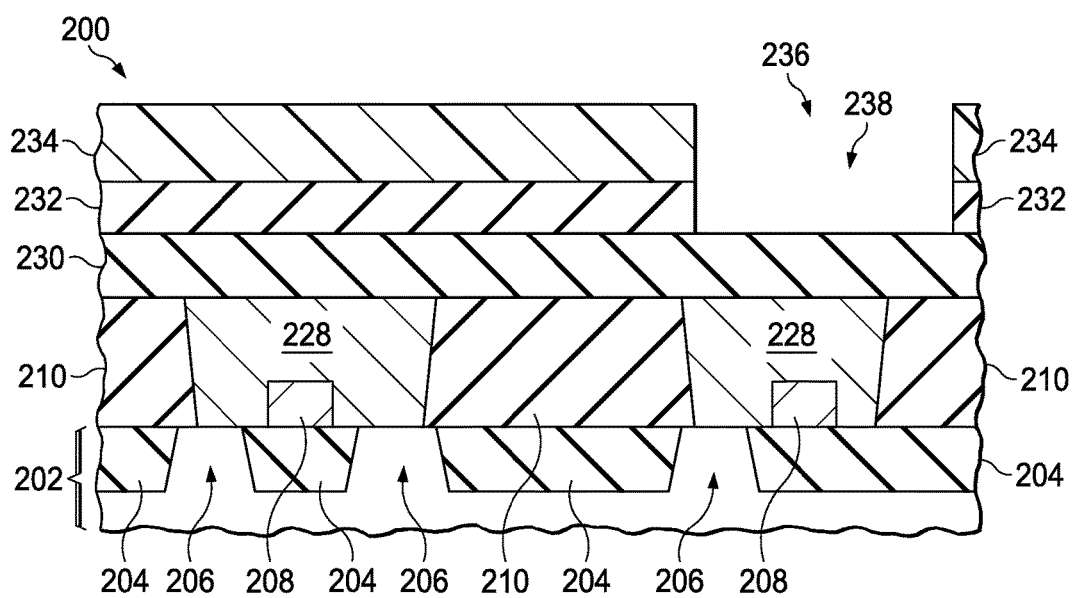

Referring to FIG. 2H, a first interconnect hard mask etch process is performed on the integrated circuit 200 which removes material from the interconnect hard mask layer 232 under the first interconnect patterned region 236 to form a first interconnect hard mask opening 238 in the interconnect hard mask layer 232. The first interconnect photosensitive layer 234 is removed after the first interconnect hard mask etch process is performed.

Figure 2I:
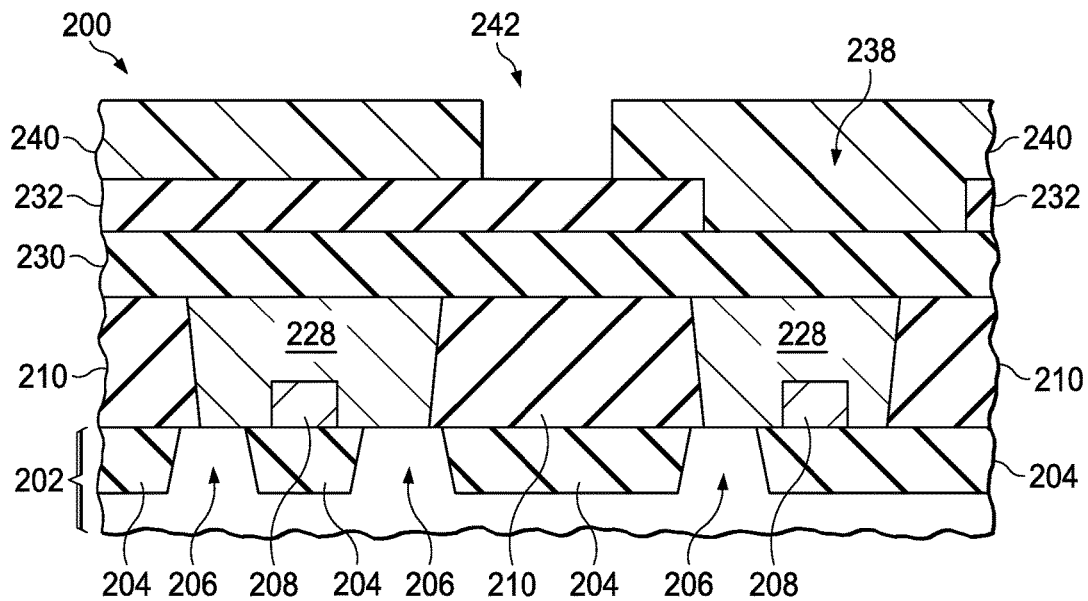

Referring to FIG. 2I, a positive acting second interconnect photosensitive layer 240 is formed over the interconnect hard mask layer 232. The second interconnect photosensitive layer may include positive photoresist, one or more optional anti-reflection layers and one or more optional layers to improve the lithography process. A second interconnect subpattern exposure operation and a second interconnect subpattern develop operation are performed on the integrated circuit 200 which form a second interconnect patterned region 242 in the second interconnect photosensitive layer 240. Other interconnect patterned regions, not shown, are formed in the second interconnect photosensitive layer 240 by the second interconnect subpattern exposure operation.

Figure 2J:
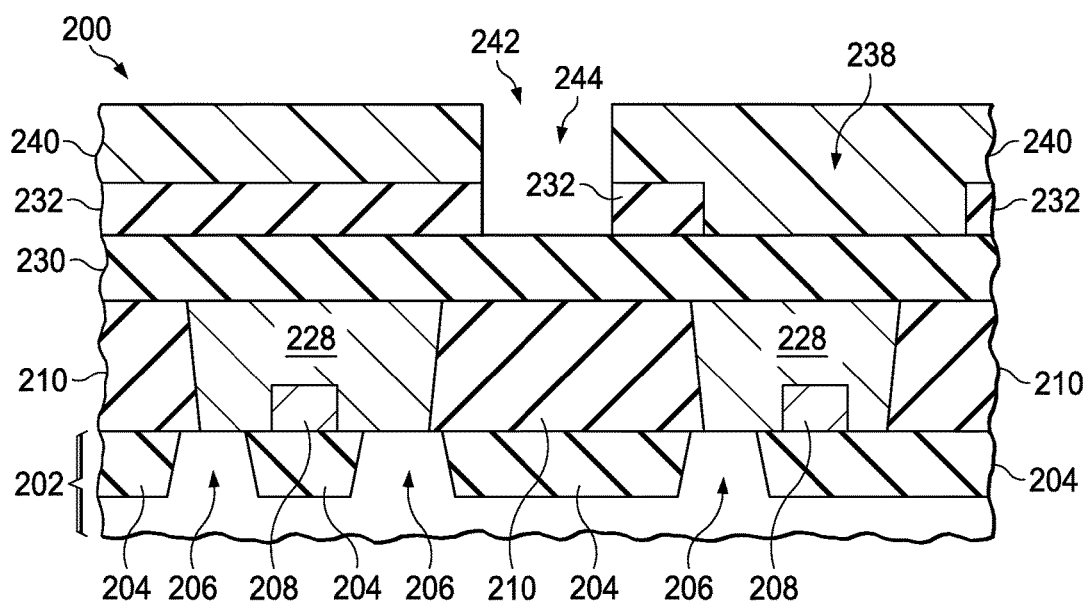

Referring to FIG. 2J, a second interconnect hard mask etch process is performed on the integrated circuit 200 which removes material from the interconnect hard mask layer 232 under the second interconnect patterned region 242 to form a second interconnect hard mask opening 244 in the interconnect hard mask layer 232. The second interconnect photosensitive layer 240 is removed after the second interconnect hard mask etch process is performed. In one version of the instant example, the second interconnect hard mask opening 244 may be located proximate to the first interconnect hard mask opening 238 by less than a spatial resolution limit of the photolithography equipment used to perform the first interconnect subpattern exposure operation and/or the second interconnect subpattern exposure operation. No other interconnect subpattern exposure operations are performed. In one version of the instant example, interconnect hard mask openings formed by the second interconnect subpattern exposure operation may abut interconnect hard mask openings formed by the first interconnect subpattern exposure operation, a condition not shown in FIG. 2J.

Figure 2K:
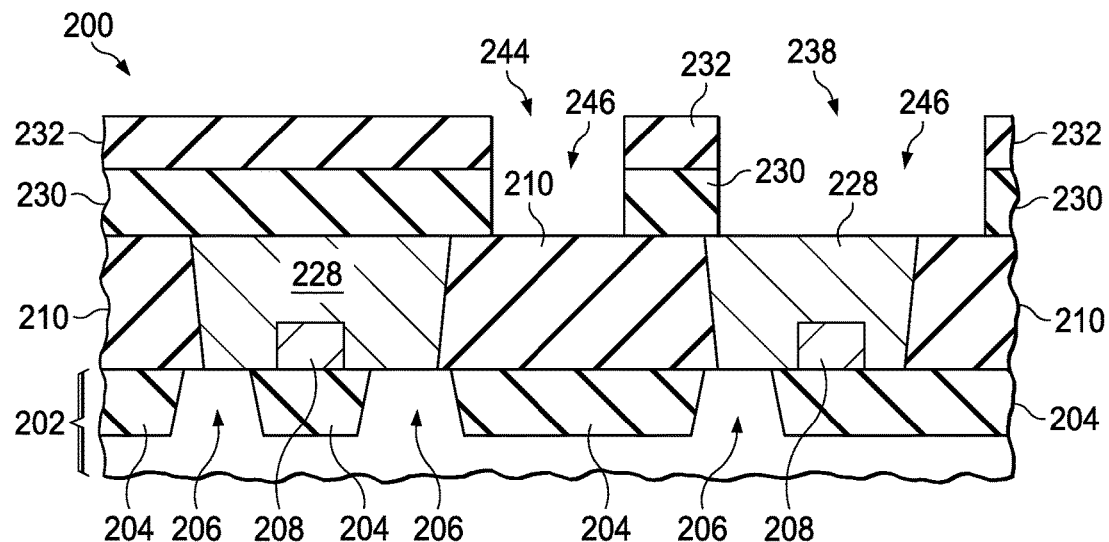

Referring to FIG. 2K, an interconnect trench etch process such as an RIE process is performed on the integrated circuit 200 which removes material from the IMD layer 230 below the first interconnect hard mask opening 238 and the second interconnect hard mask opening 244 to form interconnect trenches 246 in the IMD layer 230.

Figure 2L:
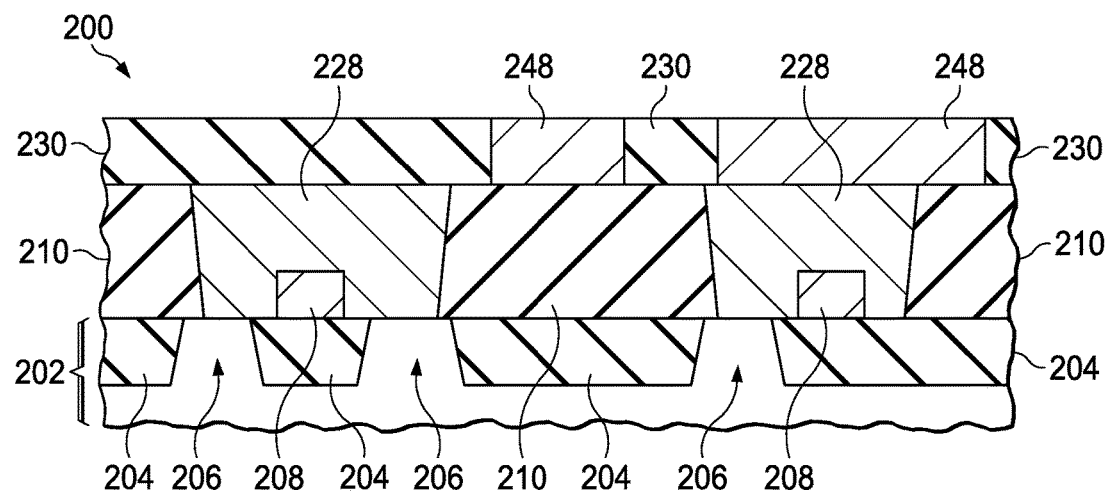

Referring to FIG. 2L, first level interconnects 248 are formed in the interconnect trenches 246 of FIG. 2K, for example by forming an interconnect metal liner such as a tantalum nitride liner in the interconnect trenches 246 of FIG. 2K, forming a layer of interconnect fill metal such as copper in the interconnect trenches and on the interconnect metal liner, and removing unwanted metal from a top surface of the ILD layer 230 using a CMP process and/or an etchback process. Bottom surfaces of a portion of or all of the first level interconnects 248 in the integrated circuit 200 directly connect to a portion of or all of the contacts 228.

Figure 2M:
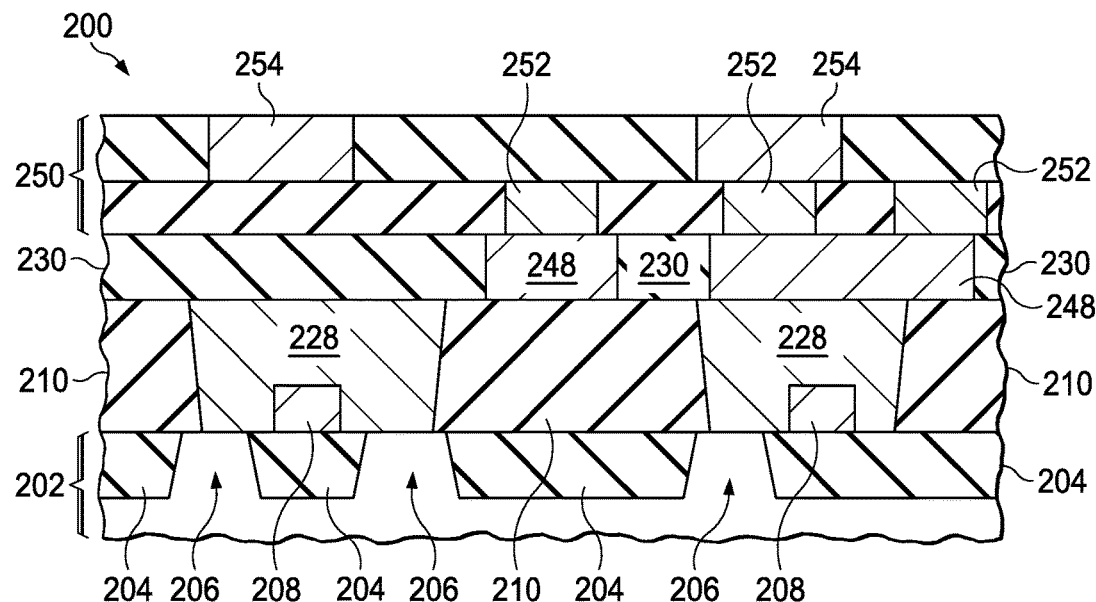

Referring to FIG. 2M, additional levels of dielectric layers and interconnects 250 for example vias 252 and second level interconnects 254, are formed above the first level interconnects 248. A plurality of interconnects 252 in the additional levels directly connects to the first level interconnects 248.

Figure 3A:
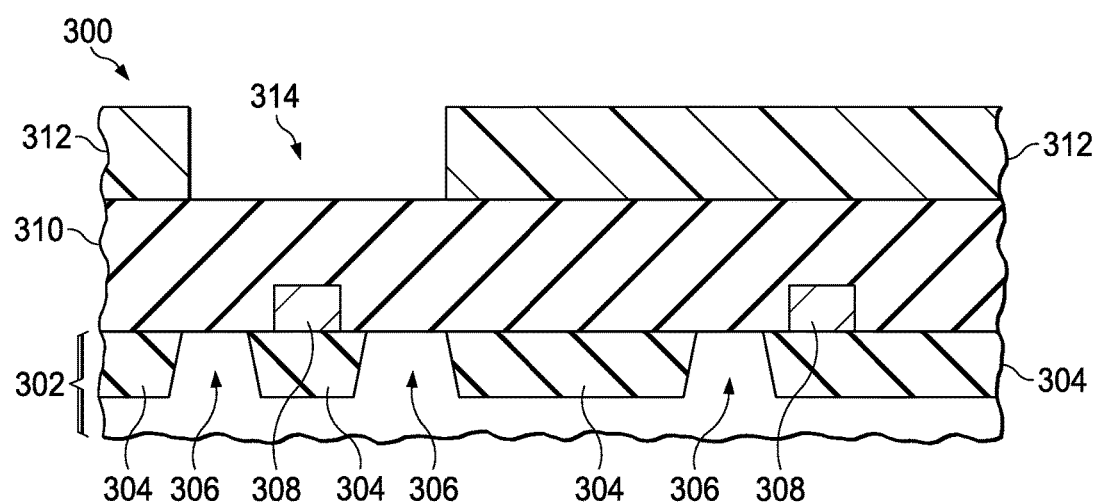
FIG. 3A through FIG. 3K are cross-sections of an integrated circuit formed according to another example, depicted in successive stages of fabrication.

FIG. 3A through FIG. 3K are cross-sections of an integrated circuit formed according to the example of FIG. 1A-1G without the optional hardmask layers, depicted in successive stages of fabrication. Referring to FIG. 3A, the integrated circuit 300 is formed in and on a substrate 302 with the properties described in reference to FIG. 2A. Elements of field oxide 304 are formed at a top surface of the substrate 302 as described in reference to FIG. 2A. Regions at the top surface of the substrate 302 between the field oxide 304 are active areas 306 of the integrated circuit 300. The active areas 306 may include a layer of metal silicide at a top surface of the substrate 302. MOS gates 308 are formed over the substrate 302. A PMD layer 310 is formed over the active areas 306 and the MOS gates 308. The PMD layer 310 may have the components and properties described in reference to FIG. 2A.

A positive acting first contact photosensitive layer 312 is formed over the PMD layer 310. The first contact photosensitive layer 312 may include positive acting photoresist, one or more optional anti-reflection layers and one or more optional layers to improve the lithography process. A first contact subpattern exposure operation using photolithographic equipment such as an immersion wafer scanner and a first contact subpattern develop operation are performed on the integrated circuit 300, which forms a first contact patterned region 314 in the first contact photosensitive layer 312. Other contact exposed regions, such as those shown in FIG. 1B (118, 120, 122), are formed in the first contact photosensitive layer 312 by the first contact subpattern exposure operation and first contact subpattern develop operation.

Figure 3B:
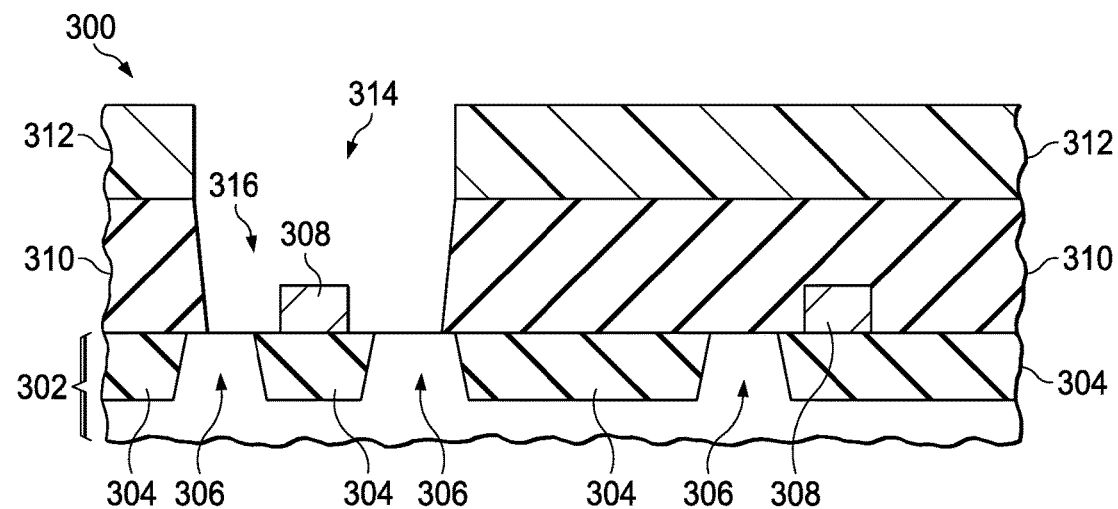

Referring to FIG. 3B, a first contact etch process is performed on the integrated circuit 300 which removes material from the PMD layer 310 under the first contact patterned region 314 to form a first contact hole 316 in the PMD layer 310. The first contact photosensitive layer 312 is removed after the first contact etch process is performed.

Figure 3C:
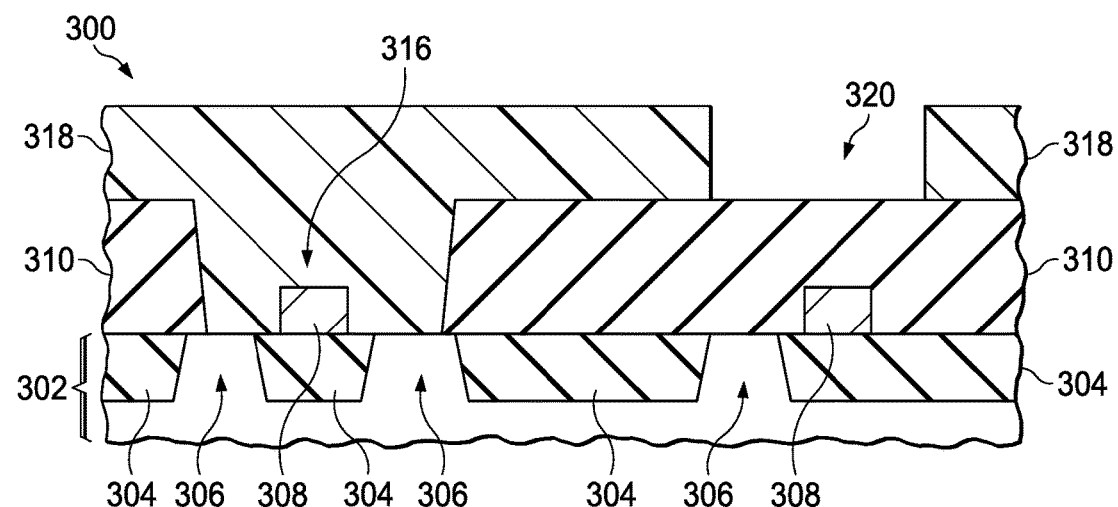

Referring to FIG. 3C, a positive acting second contact photosensitive layer 318 is formed over the PMD layer 310. The second contact photosensitive layer 318 has similar components and properties as the first contact photosensitive layer 312 of FIG. 3A. A second contact subpattern exposure operation and a second contact subpattern develop operation are performed on the integrated circuit 300 which forms a second contact patterned region 320 in the second contact photosensitive layer 318. Other contact exposed regions, such as those shown in FIG. 1C (126), are formed in the second contact photosensitive layer 318 by the second contact subpattern exposure operation and the second contact subpattern develop operation.

Figure 3D:
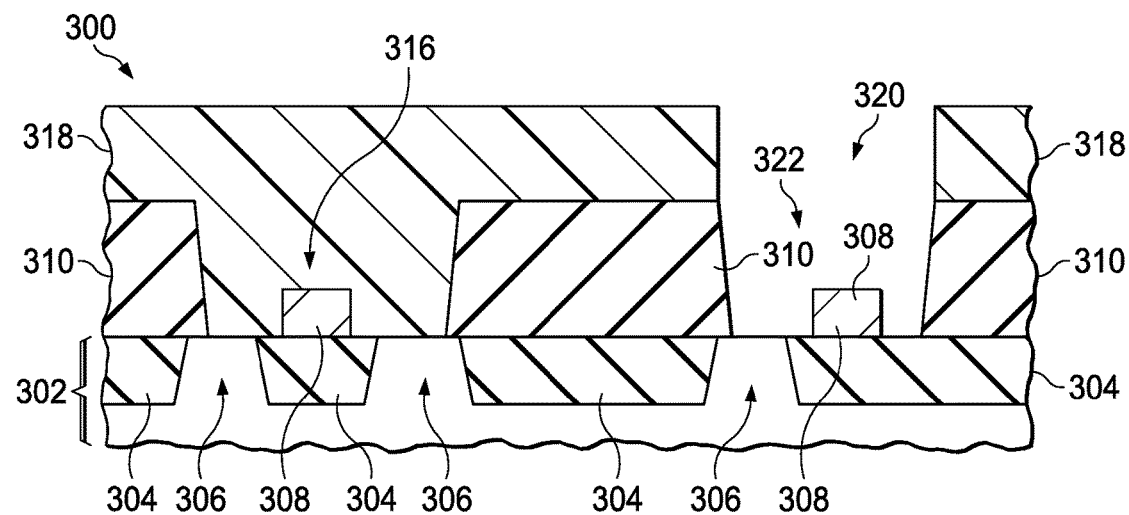

Referring to FIG. 3D, a second contact etch process is performed on the integrated circuit 300 which removes material from the PMD layer 310 under the second contact patterned region 320 to form a second contact hole 322 in the PMD layer 310. The second contact photosensitive layer 318 is removed after the second contact etch process is performed. In one version of the instant example, the second contact hole 322 may be located proximate to the first contact hole 316 by less than a spatial resolution limit of the photolithography equipment used to perform the first contact subpattern exposure operation and/or the second contact subpattern exposure operation. No other contact subpattern exposure operations are performed. In one version of the instant example, contact holes formed by the second contact subpattern exposure operation may abut contact holes formed by the first contact subpattern exposure operation, a condition not shown in FIG. 3D.

Figure 3E:
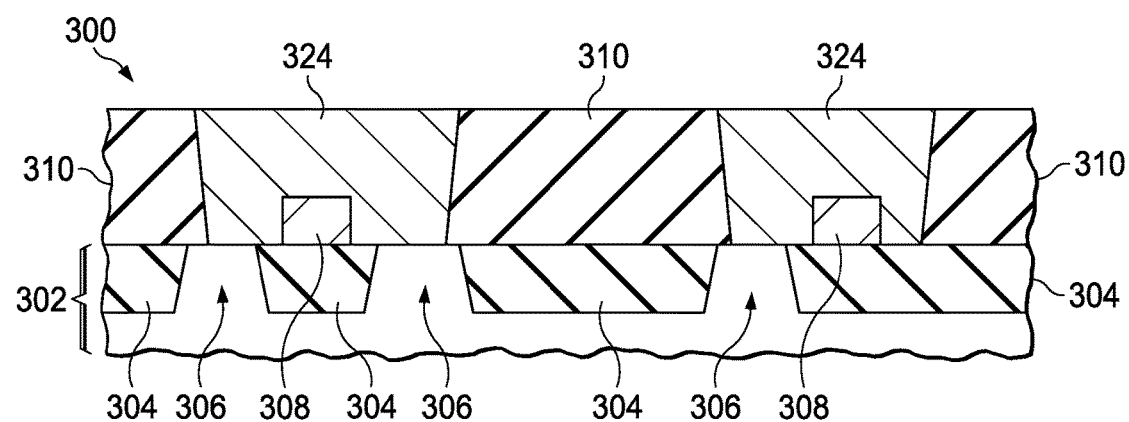

Referring to FIG. 3E, contacts 324 are formed in the contact holes 316 and 322 of FIG. 3D, for example by forming a contact metal liner such as a titanium liner in the contact holes 316 and 322, forming a layer of contact fill metal such as tungsten in the contact holes 316 and 322 on the contact metal liner, and removing unwanted metal from a top surface of the PMD layer 310 using a CMP process and/or an etchback process. Bottom surfaces of a portion of or all of the contacts 324 formed in the integrated circuit 300 connect to a portion of or all of the active areas 306 and the MOS gates 308. The contacts 324 may in some instances extend past edges of the active areas 306 and/or the MOS gates 308 or may in other instances not extend past edges of the active areas 306 and/or the MOS gates 308.

Figure 3F:
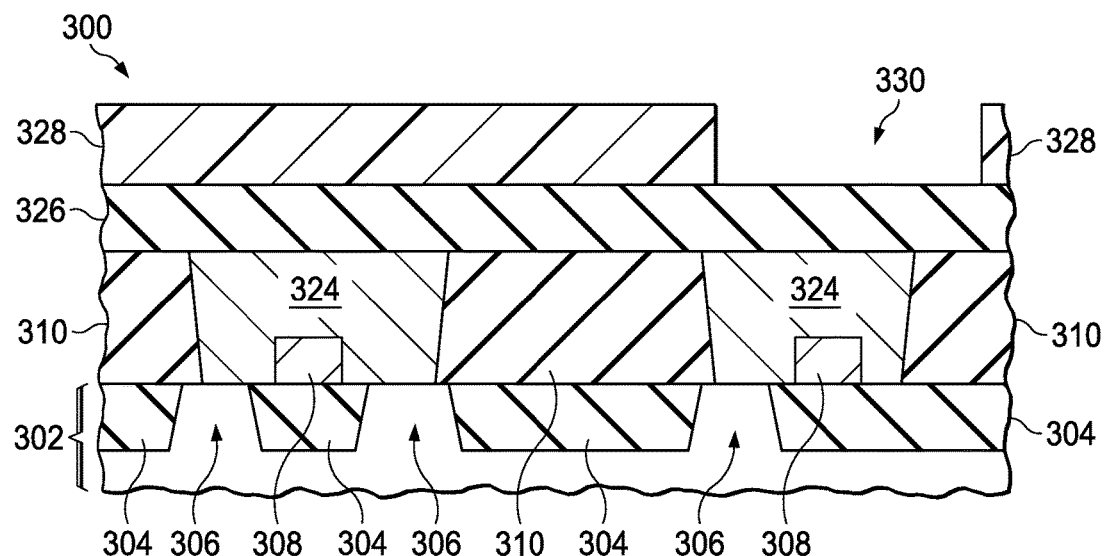

Referring to FIG. 3F, an IMD layer 326 is formed over the contacts 324 and the PMD layer 310. The IMD layer 326 may include a low-k dielectric material. The IMD layer 326 may also include an etch stop sublayer, not shown, adjacent to the contacts 324. The IMD layer 326 may further include a cap sublayer, not shown, at a top surface of the IMD layer 326. A positive acting first interconnect photosensitive layer 328 is formed over the IMD layer 326. The first interconnect photosensitive layer may include positive photoresist, one or more optional anti-reflection layers and one or more optional layers to improve the lithography process. A first interconnect subpattern exposure operation and a first interconnect subpattern develop operation are performed on the integrated circuit 300 which form a first interconnect patterned region 330 in the first interconnect photosensitive layer 328. Other interconnect patterned regions, not shown, are formed in the first interconnect photosensitive layer 328 by the first interconnect subpattern exposure operation.

Figure 3G:
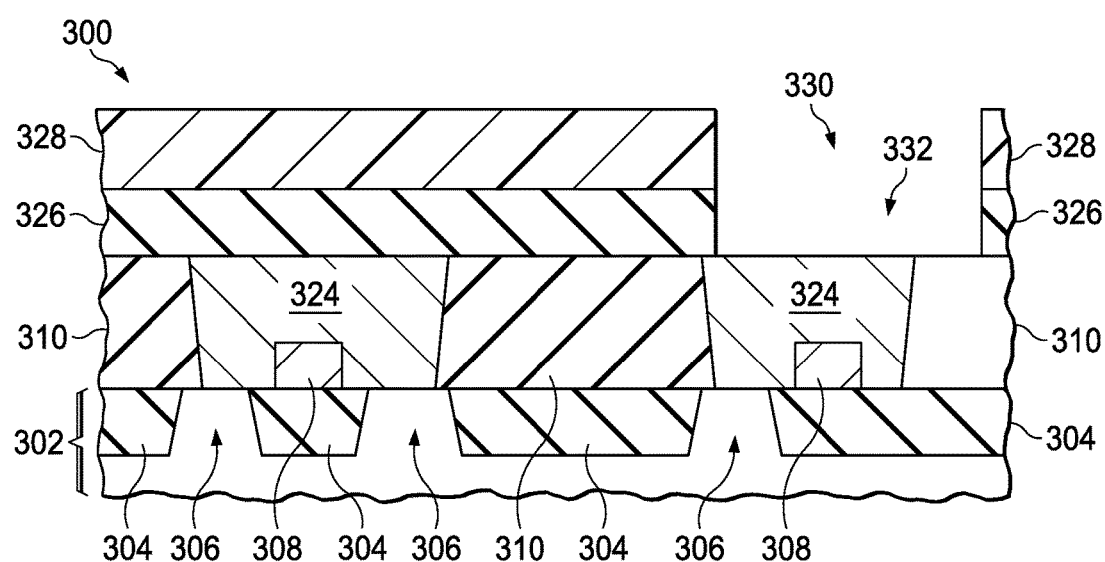

Referring to FIG. 3G, a first interconnect etch process is performed on the integrated circuit 300 which removes material from the IMD layer 326 under the first interconnect patterned region 330 to form a first interconnect trench 332 in the IMD layer 326. The first interconnect photosensitive layer 328 is removed after the first interconnect etch process is performed.

Figure 3H:
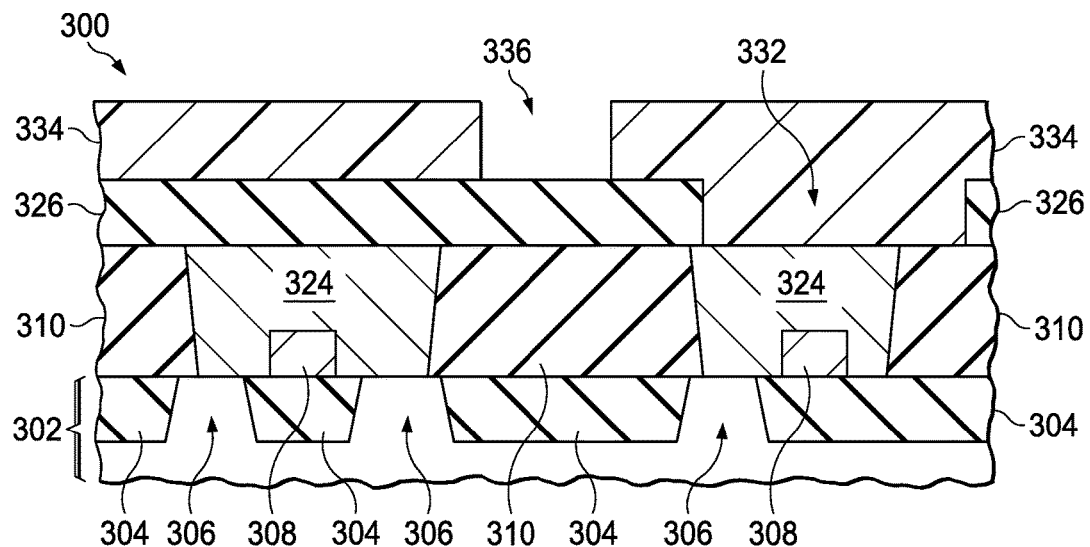

Referring to FIG. 3H, a positive acting second interconnect photosensitive layer 334 is formed over the IMD layer 326. The second interconnect photosensitive layer may include positive photoresist, one or more optional anti-reflection layers and one or more optional layers to improve the lithography process. A second interconnect subpattern exposure operation and a second interconnect subpattern develop operation are performed on the integrated circuit 300 which form a second interconnect patterned region 336 in the second interconnect photosensitive layer 334. Other interconnect patterned regions, not shown, are formed in the second interconnect photosensitive layer 334 by the second interconnect subpattern exposure operation.

Figure 3I:
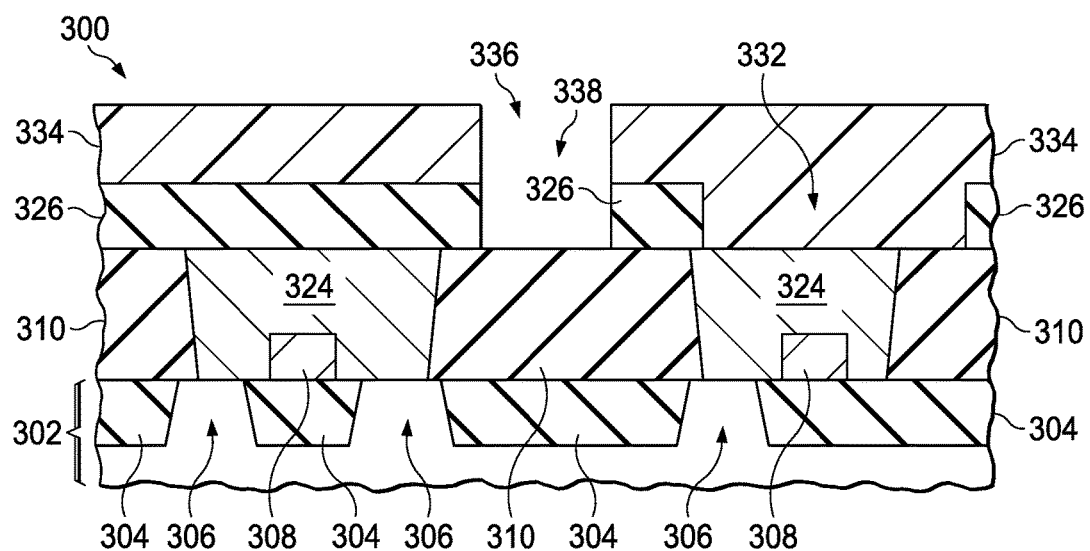

Referring to FIG. 3I, a second interconnect etch process is performed on the integrated circuit 300 which removes material from the IMD layer 326 under the second interconnect patterned region 336 to form a second interconnect trench 338 in the IMD layer 326. The second interconnect photosensitive layer 334 is removed after the second interconnect hard mask etch process is performed. In one version of the instant example, the second interconnect trench 338 may be located proximate to the first interconnect trench 332 by less than a spatial resolution limit of the photolithography equipment used to perform the first interconnect subpattern exposure operation and/or the second interconnect subpattern exposure operation. No other interconnect subpattern exposure operations are performed. In one version of the instant example, some interconnect trenches formed by the second interconnect subpattern exposure operation may abut some interconnect trenches formed by the first interconnect subpattern exposure operation, a condition not shown in FIG. 3I.

Figure 3J:
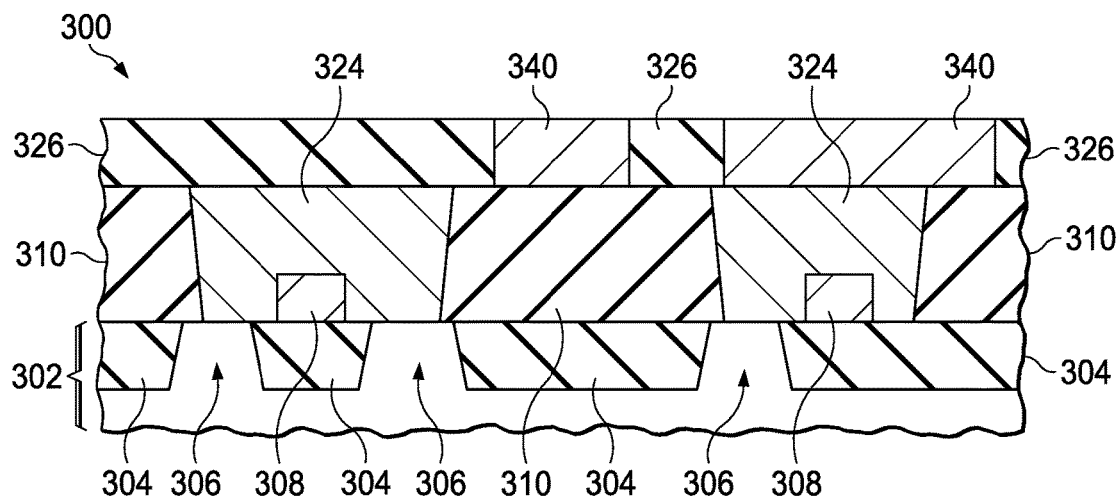

Referring to FIG. 3J, first level interconnects 340 are formed in the interconnect trenches 332 and 338 of FIG. 3I, for example by forming an interconnect metal liner such as a tantalum nitride liner in the interconnect trenches 332 and 338, forming a layer of interconnect fill metal such as copper in the interconnect trenches on the interconnect metal liner, and removing unwanted metal from a top surface of the IMD layer 326 using a CMP process and/or an etchback process. Bottom surfaces of a portion of or all of the first level interconnects 340 in the integrated circuit 300 directly connect to a portion of or all of the contacts 324.

Figure 3K:
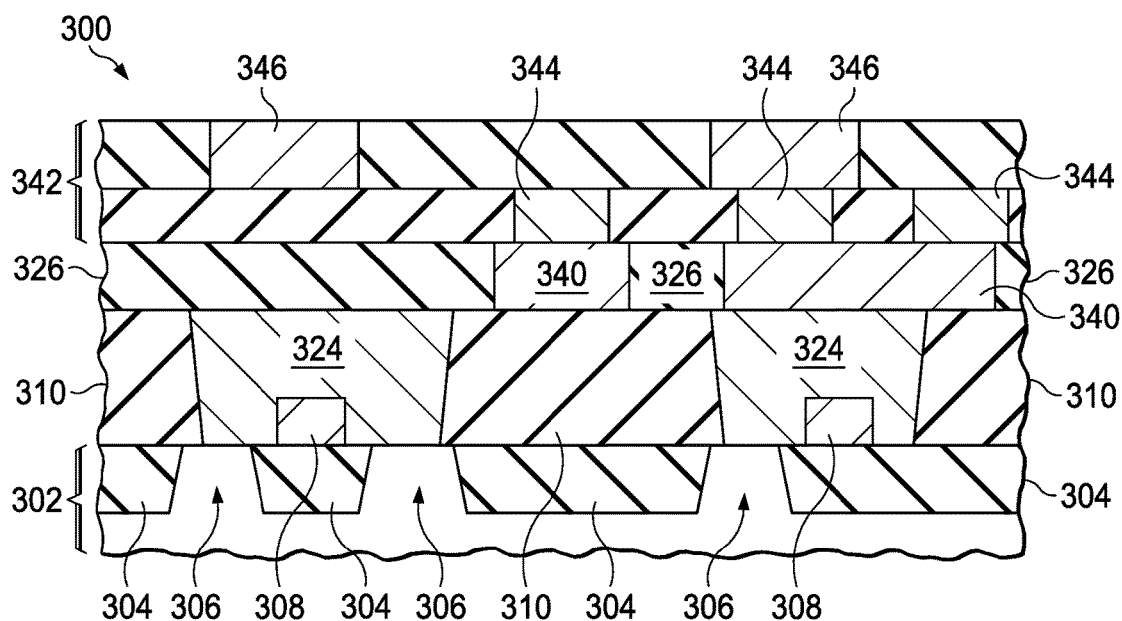

Referring to FIG. 3K, additional levels of dielectric layers and interconnects 342 for example vias 344 and second level interconnects 346, are formed above the first level interconnects 340. A plurality of interconnects 344 in the additional levels directly connects to the first level interconnects 340.

It will be recognized that in a further example, contacts may be formed using a contact hard mask process as described in reference to FIG. 2A through FIG. 2F and first level interconnects may be formed without using an interconnect hard mask as described in reference to FIG. 3F through FIG. 3J. It will be also recognized that in yet another example, contacts may be formed without using a contact hard mask process as described in reference to FIG. 3A through FIG. 3E and first level interconnects may be formed using an interconnect hard mask as described in reference to FIG. 2G through FIG. 2L.

While various examples of the present invention have been described above, it should be understood that they have been presented by way of example only and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

What is claimed is:

1. An integrated circuit, comprising:
   a substrate;
   field oxide elements in the substrate at a top surface of the substrate;
   active areas in the substrate between the field oxide elements;
   metal oxide semiconductor (MOS) transistor gates over the substrate;
   a pre-metal dielectric (PMD) layer over the active areas and the MOS transistor gates;
   a plurality of contacts in the PMD layer, such that bottom surfaces of the contacts connect to the active areas and the MOS transistor gates, wherein:
      a subset of the plurality of contacts are elongated contacts;
      a first plurality of the elongated contacts, each elongated contact of the first plurality of elongated contacts directly connects to at least three of any combination of the active areas and the MOS transistor gates; and
      a second plurality of the elongated contacts, each elongated contact of the second plurality of elongated contacts directly connect to exactly two of any combination of the active areas and the MOS transistor gates;
   an intra metal dielectric (IMD) layer over the contacts and the PMD layer;
   a plurality of first level interconnects in the IMD layer, such that bottom surfaces of the first level interconnects directly connect to the contacts, such that members of the second plurality of the elongated contacts directly connect to at least one of the first level interconnects;
   a plurality of dielectric layers above the first level interconnects; and
   a plurality of interconnects in the dielectric layers, such that the plurality of the interconnects directly connects to the plurality of the first level interconnects.

2. The integrated circuit of claim 1, wherein the contacts include a contact liner metal and a contact fill metal on the contact liner metal.

3. The integrated circuit of claim 1, wherein the first level interconnects include an interconnect metal liner and copper interconnect fill metal on the interconnect metal liner.

4. The integrated circuit of claim 1, wherein the plurality of contacts includes elongated single node contacts, such that each of the elongated single node contacts is connected to exactly one of the active areas or the MOS transistor gates, and the elongated single node contacts have length:width ratios above 2.

5. The integrated circuit of claim 1, further including a complementary metal oxide semiconductor (CMOS) inverter, the CMOS inverter including:
   an inverter p-type active area in the substrate, the inverter p-type active area including an output node;
   an inverter n-type active area in the substrate proximate to the inverter p-type active area, the inverter n-type active area including an output node;
   an inverter MOS transistor gate above the substrate crossing the inverter p-type active area and the inverter n-type active area;
   an inverter output node elongated contact connecting the output node of the inverter p-type active area and the output node of the inverter n-type active area; and
   a first level interconnect directly connected to the inverter output node elongated contact.

6. The integrated circuit of claim 1, further including a CMOS dual input logic gate, the CMOS dual input logic gate including:
   a CMOS dual input logic gate p-type active area in the substrate, the CMOS dual input logic gate p-type active area including an output node;
   a CMOS dual input logic gate n-type active area in the substrate proximate to the CMOS dual input logic gate p-type active area, the CMOS dual input logic gate n-type active area including an output node;
   two dual input logic gate MOS transistor gates above the substrate crossing the CMOS dual input logic gate p-type active area and the CMOS dual input logic gate n-type active area;
   a CMOS dual input logic gate output node elongated contact connecting the output node of the CMOS dual input logic gate p-type active area and the output node of the CMOS dual input logic gate n-type active area; and
   a first level interconnect directly connected to the CMOS dual input logic gate output node elongated contact.

7. An integrated circuit, comprising:
   a substrate;
   active areas in the substrate;
   metal oxide semiconductor (MOS) transistor gates over the substrate;
   a pre metal dielectric (PMD) layer over the active areas and the MOS transistor gates;
   a plurality of contacts in the PMD layer, wherein:
      a subset of the plurality of contacts are elongated contacts;
      the elongated contacts include a first plurality of the elongated contacts, each elongated contact of the first plurality of elongated contacts extends between at least three of any combination of the active areas and the MOS transistor gates; and
      the elongated contacts includes a second plurality of the elongated contacts, each elongated contact of the second plurality of elongated contacts extends between exactly two of any combination of the active areas and the MOS transistor gates.

8. The integrated circuit of claim 7, further comprising:
   first level metal interconnects over the contacts, such that elongated contacts of the second plurality of the elongated contacts directly connect to at least one of the first level metal interconnects; and
   second level metal interconnects over the first level metal interconnects, such that at least one of the second level metal interconnects connects to an elongated contact of the second plurality of elongated contacts through the first level metal interconnects.

9. The integrated circuit of claim 7, wherein the contacts include a contact liner metal and a contact fill metal on the contact liner metal.

10. The integrated circuit of claim 7, wherein the first level interconnects include an interconnect metal liner and copper interconnect fill metal on the interconnect metal liner.

11. The integrated circuit of claim 7, wherein the plurality of contacts includes elongated single node contacts, such that each of the elongated single node contacts is connected to exactly one of the active areas or the MOS transistor gates, and the elongated single node contacts have length:width ratios above 2.

* * * * *